US010252454B2

(12) United States Patent
Matsuo

(10) Patent No.: US 10,252,454 B2
(45) Date of Patent: Apr. 9, 2019

(54) MANUFACTURING METHOD OF SEMICONDUCTOR DEVICE

(71) Applicant: Renesas Electronics Corporation, Tokyo (JP)

(72) Inventor: Itaru Matsuo, Gunma (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/939,563

(22) Filed: Mar. 29, 2018

(65) Prior Publication Data

US 2018/0281255 A1 Oct. 4, 2018

(30) Foreign Application Priority Data

Mar. 31, 2017 (JP) .................................. 2017-071814

(51) Int. Cl.
*H01L 21/56* (2006.01)
*B29C 45/76* (2006.01)
(Continued)

(52) U.S. Cl.
CPC ........ *B29C 45/76* (2013.01); *B29C 45/14467* (2013.01); *B29C 45/1753* (2013.01);
(Continued)

(58) Field of Classification Search
CPC ....... H01L 21/565; H01L 21/56; H01L 23/31; H01L 23/495; H01L 23/3107; H01L 23/29; H01L 2224/04042; H01L 2224/32245; H01L 2224/48091; H01L 2224/48247; H01L 2224/73265; H01L 2224/92247;
(Continued)

(56) References Cited

U.S. PATENT DOCUMENTS 9,728,510 B2 * 8/2017 Xue ....................... H01L 23/043
9,837,288 B2 * 12/2017 Basler ................. H01L 23/4006
(Continued)

FOREIGN PATENT DOCUMENTS

| DE | 33 20 700 A1 | 12/1984 |
| EP | 0 633 111 A2 | 1/1995 |
| JP | 09-123183 A | 5/1997 |

OTHER PUBLICATIONS

Extended European Search Report received in corresponding European Application No. 18161927.1 dated Aug. 31, 2018.

*Primary Examiner* — Chuong A Luu
(74) *Attorney, Agent, or Firm* — Mattingly & Malur, PC

(57) ABSTRACT

A manufacturing method of a semiconductor device includes the steps of: preparing a lead frame; mounting a plurality of semiconductor chips on the lead frame; and sealing one portion of the lead frame with a sealing resin. The resin-sealing step includes the step of: disposing the lead frame, molds having main surfaces on which cavity parts are formed, the lead frame being disposed on the main surface of the heated molds; injecting a resin in the main surfaces of the heated molds so as to seal the one portion of the lead frame with the sealing resin; and taking out the lead frame from the heated molds. In the taking-out step, while the lead frame is taken out, the main surfaces of the molds are inspected by using a sensor, and the sensor is cooled and formed integrally with an arm used for taking out the lead frame.

13 Claims, 20 Drawing Sheets

(51) Int. Cl.
  *B29C 45/17* (2006.01)
  *H01L 23/31* (2006.01)
  *H01L 23/495* (2006.01)
  *B29C 45/14* (2006.01)
  *B29L 31/34* (2006.01)

(52) U.S. Cl.
  CPC .......... *B29C 45/768* (2013.01); *H01L 21/565* (2013.01); *H01L 23/3107* (2013.01); *H01L 23/495* (2013.01); *B29C 45/14655* (2013.01); *B29C 2945/76147* (2013.01); *B29C 2945/76257* (2013.01); *B29C 2945/76464* (2013.01); *B29C 2945/76652* (2013.01); *B29C 2945/76735* (2013.01); *B29L 2031/3481* (2013.01); *H01L 2224/04042* (2013.01); *H01L 2224/32245* (2013.01); *H01L 2224/48091* (2013.01); *H01L 2224/48247* (2013.01); *H01L 2224/73265* (2013.01); *H01L 2224/92247* (2013.01); *H01L 2224/97* (2013.01)

(58) Field of Classification Search
  CPC ..... H01L 2224/97; H01L 21/50; H01L 21/60; H01L 23/49513; H01L 23/49575; H01L 23/79541
  USPC .......................................................... 438/123
  See application file for complete search history.

(56) References Cited

U.S. PATENT DOCUMENTS

| | | |
|---|---|---|
| 2004/0115295 A1 | 6/2004 | Schunck et al. |
| 2016/0263799 A1 | 9/2016 | Shiraishi |
| 2018/0016133 A1* | 1/2018 | Cadag .................... B81B 7/007 |

* cited by examiner

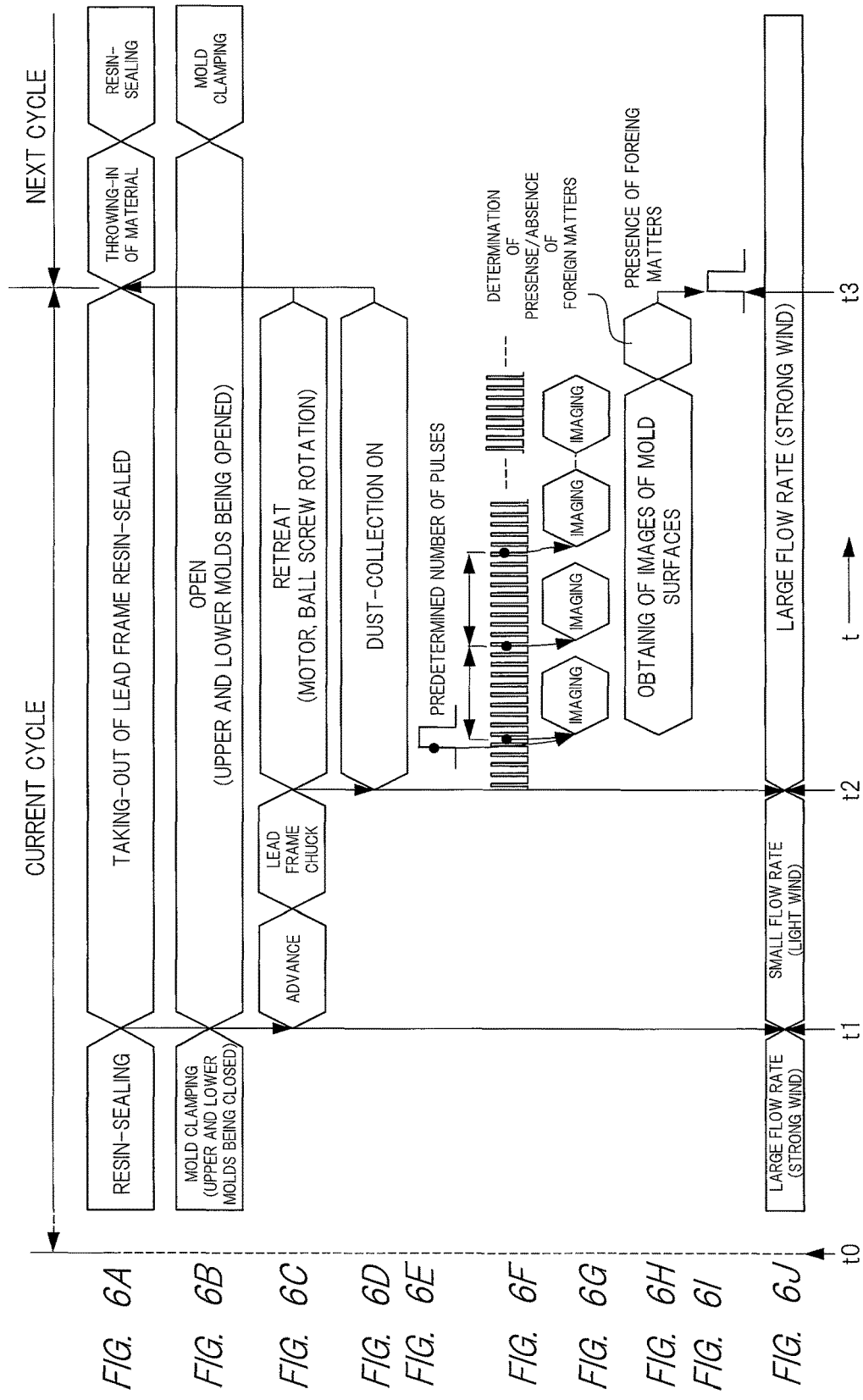

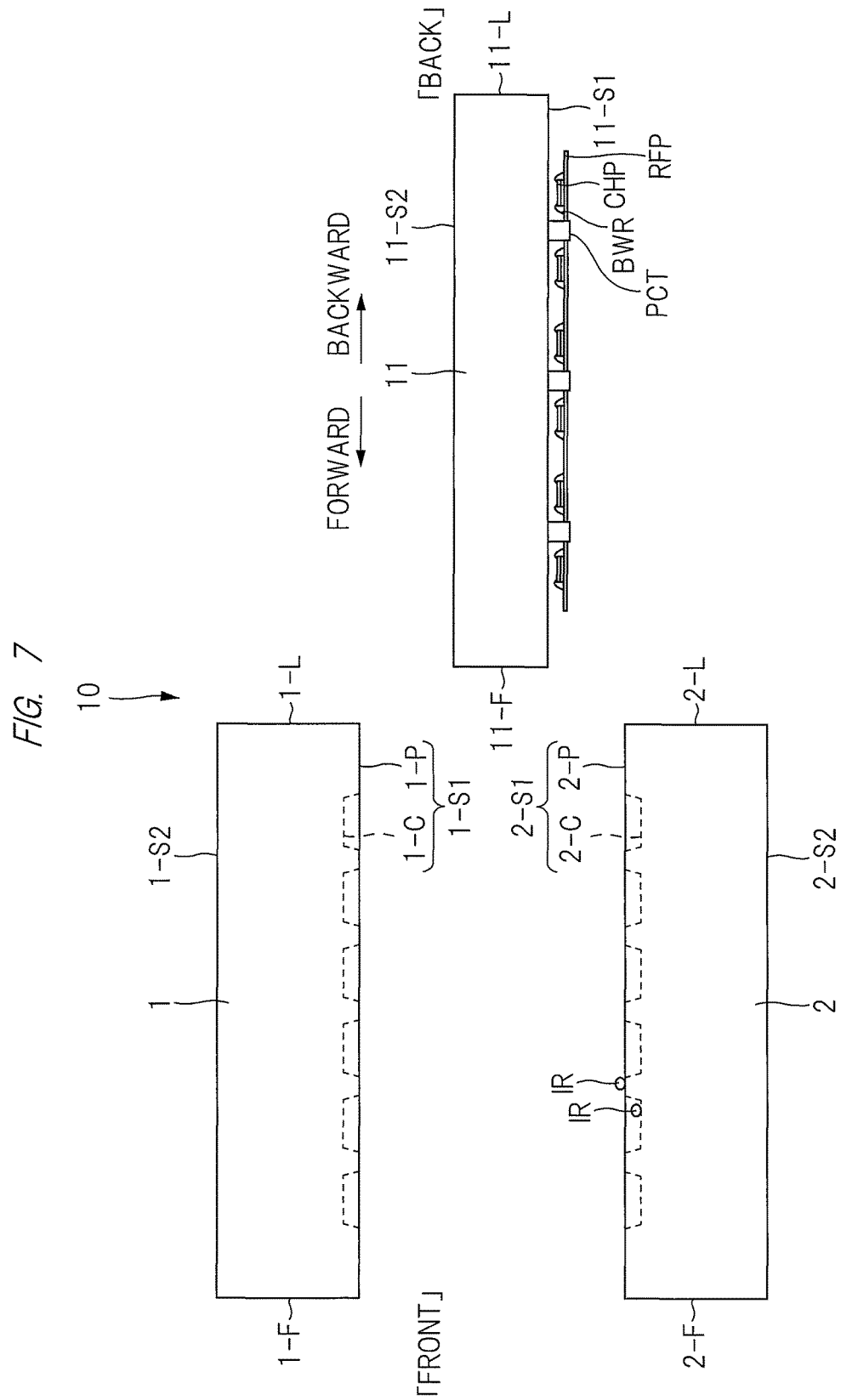

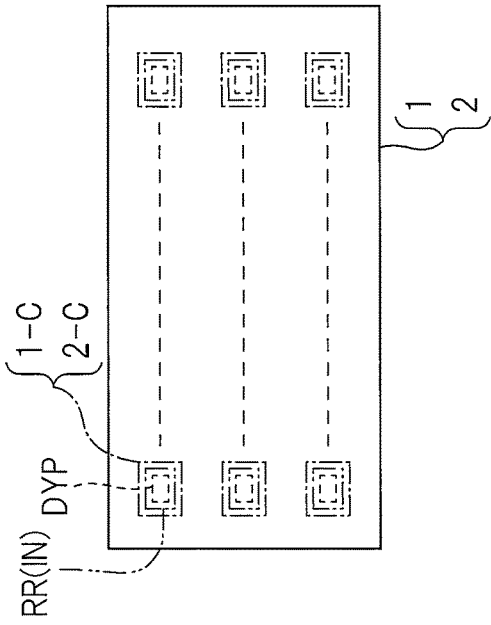
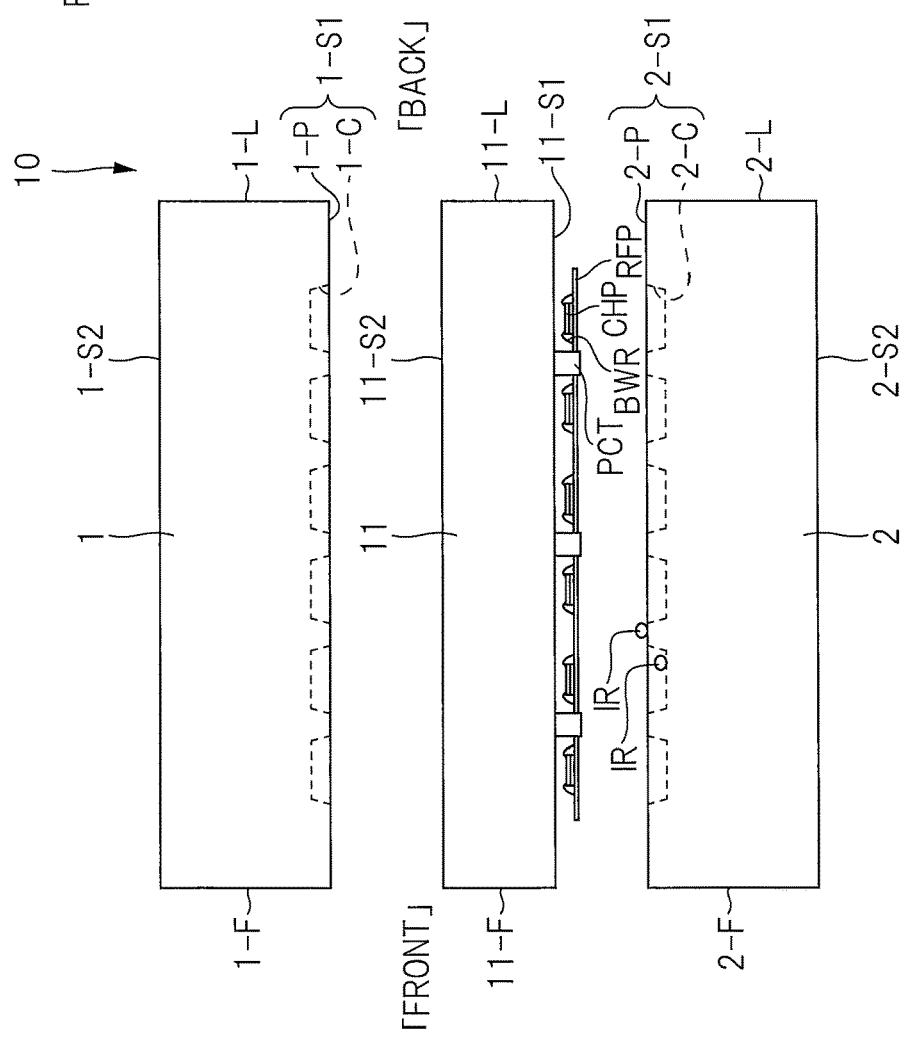

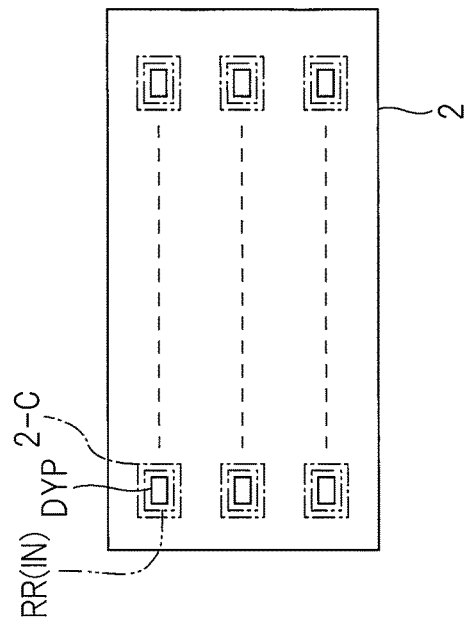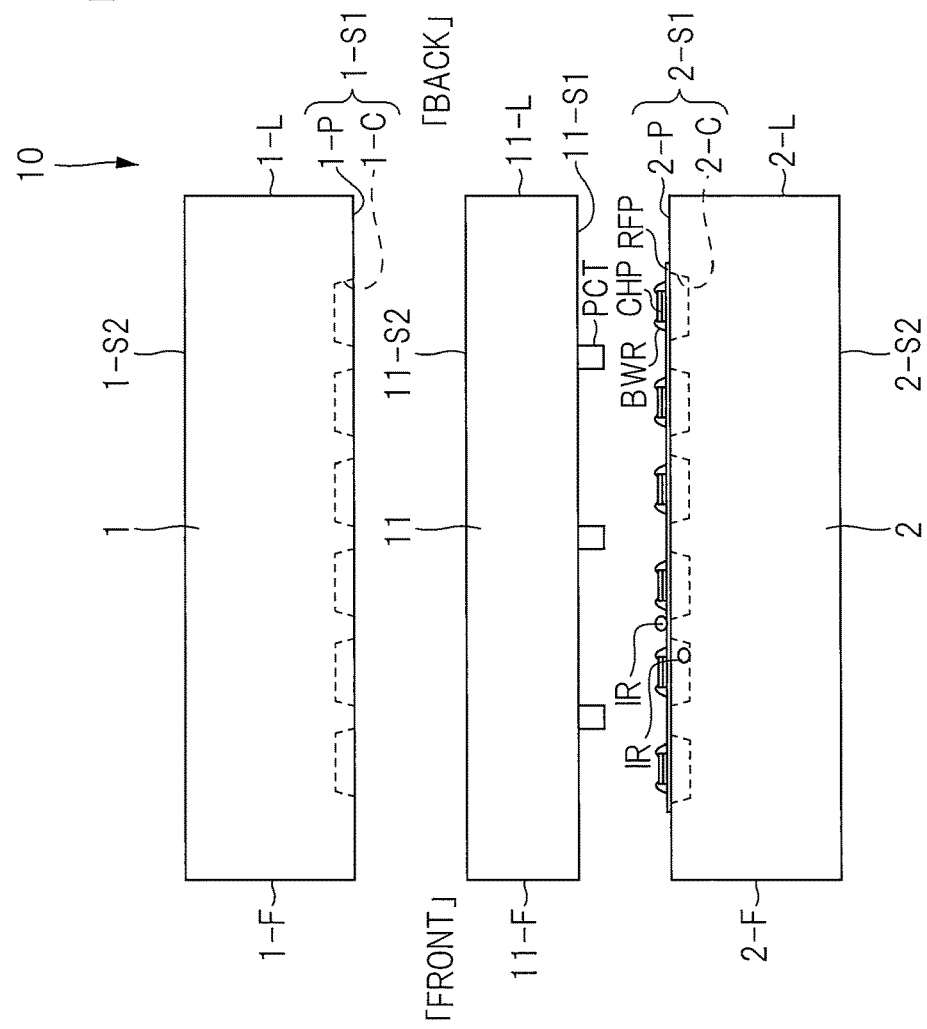

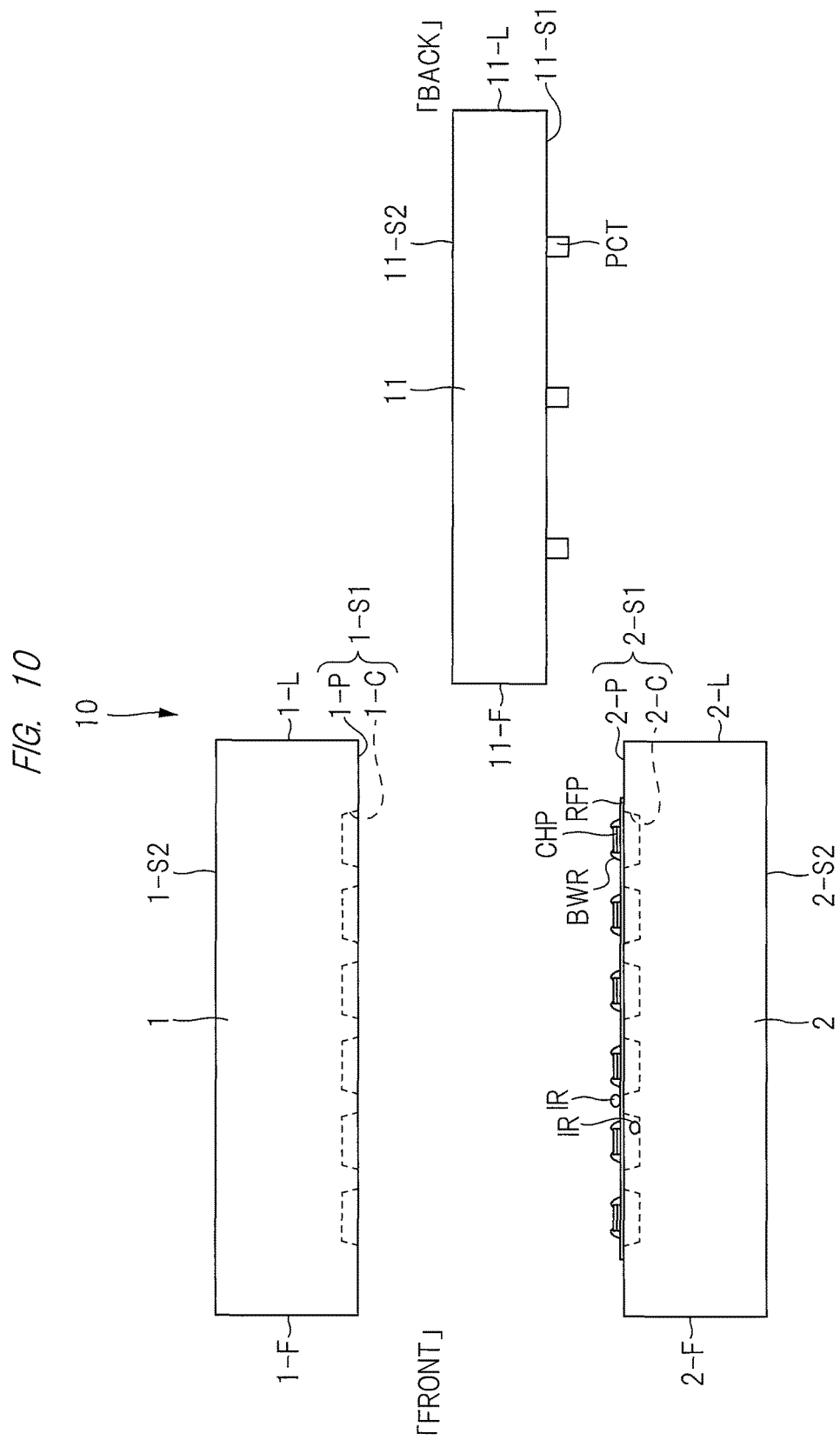

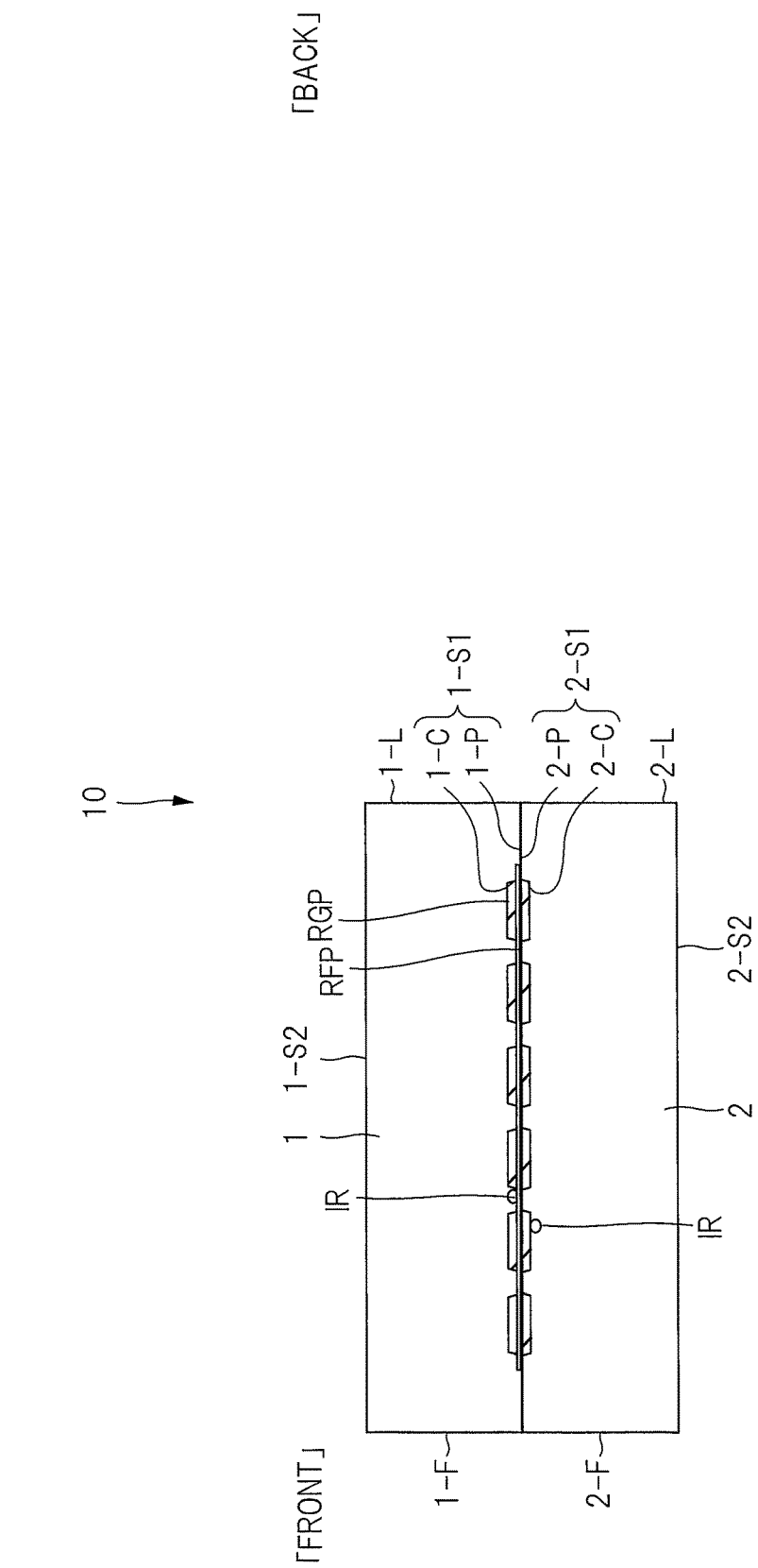

MANUFACTURING METHOD OF SEMICONDUCTOR DEVICE

CROSS-REFERENCE TO RELATED APPLICATION

The present application claims priority from Japanese Patent Application No. 2017-71814 filed on Mar. 31, 2017, the content of which is hereby incorporated by reference into this application.

TECHNICAL FIELD OF THE INVENTION

The present invention relates to a manufacturing method of a semiconductor device, for example, a semiconductor device manufacturing method provided with a process for sealing, with a resin, a lead frame on which semiconductor chips are mounted.

BACKGROUND OF THE INVENTION

A semiconductor device is provided by: mounting semiconductor chips on, for example, a lead frame (or a base material); electrically connecting electrodes (bonding pads) of the semiconductor chips and the lead frame to one another by wires; and then packaging them, various circuit blocks being formed on the semiconductor chips. The packaging is carried out by partially sealing the lead frame with, for example, a resin by using a molding device, the semiconductor chips being mounted on the lead frame.

In the molding device, the lead frame on which the semiconductor chips are mounted is sandwiched between an upper mold and a lower mold that are respectively heated, and the upper mold and the lower mold are tightened by a presser. In a main surface of the upper mold and a main surface of the lower mold that is opposed to the main surface of the upper mold, cavity parts having respectively predetermined shapes are formed, and the lead frame is disposed between the upper and lower molds so that the semiconductor chips are located at the cavity parts. Moreover, when the molds are tightened, the resin is injected so as to fill the cavity parts. Thus, the semiconductor chips and a portion of the lead frame (tab or the like) on which the semiconductor chips are mounted are sealed with a resin having predetermined shapes, and provided as a semiconductor device that has been packaged.

Such a molding device has been disclosed by, for example, Patent Document 1 (Japanese Patent Application Laid-open No. H9-123183). Incidentally, in Patent Document 1, this molding device is referred to as a "transfer molding device".

SUMMARY OF THE INVENTION

After sealing the lead frame with the resin, resin waste, resin burrs and the like of the injected resin etc. sometimes undesirably remain on the main surface of the upper mold or/and the main surface of the lower mold. The resin waste, resin burrs and the like become foreign matters when a next lead frame is sealed with a resin. Presence of such foreign matters brings deformation of the wires for connecting the bonding pads and the lead frame with one another in sealing the lead frame with the resin, and there is a possibility that a short circuit will occur between the wires. Moreover, on the upper mold or/and lower mold, an air vent for discharging excessive air generated at the sealing is formed. However, foreign matters clog the air vent, which brings a possibility that void defects will be caused. Both of such cases lead to a reduction of yield. In order to prevent the reduction of yield, for example, the lead frame that has been resin-sealed is taken out from the upper mold and the lower mold, and then cleaning is carried out to the main surfaces of the upper and lower molds by a cleaning mechanism.

Patent Document 1 discloses that, in regular cleaning work about the upper mold and the lower mold, the upper mold and the lower mold so as not to leave waste of a resin for cleaning, and a mirror is provided on the cleaning mechanism to visually confirm a degree of cleaning.

In Patent Document 1, since the resin waste or the like is visually confirmed, a comparatively large size such as about several millimeters is required as a size capable of being confirmed. Moreover, since the visual confirmation is carried out, a moving speed of the cleaning mechanism provided with a mirror is also required to be a low speed (for example, about 20 to 30 mm/sec). Although a technique described in Patent Document 1 can detect the resin waste or the like having the comparatively large size by the regular cleaning work, the technique is not suitable for detecting foreign matters such as resin waste at the time of mass-producing semiconductor devices as described next.

That is, since the visual confirmation for the resin waste or the like is carried out in Patent Document 1, the moving speed of the cleaning mechanism is required to be made slower. In contrast, at the time of mass-producing the semiconductor devices, the moving speed of the cleaning mechanism becomes, for example, 150 mm/sec or more. Consequently, it becomes difficult to visually confirm the resin waste or the like. Moreover, the size of a foreign matter that poses a problem at the time of mass-production is about several hundred micrometers. On the other hand, the size that can be visually confirmed is limited to about several millimeters. For those reasons, also from the viewpoint of the sizes of the foreign matters to cause the problem, it is difficult for the technique of Patent Document 1 to detect the resin waste or the like at the time of the mass-production.

Furthermore, a range of the size that can be visually confirmed is greatly dependent on skill of an inspector. Therefore, even when inspectors are trained, it is estimated that an error of about 1 mm occurs among the inspectors. That is, since a difference occurs among the results of the visual confirmation by the inspectors, stable inspection results cannot be obtained. Moreover, in order to carry out visual detection, the inspectors are always required to stay at the time of the mass-production, which needs enormous labor costs.

The other objects and novel characteristics of the present invention will be apparent from the description of the present specification and the accompanying drawings.

A manufacturing method of a semiconductor device according to the preset invention will be described as follows.

That is, a manufacturing method of a semiconductor device includes: (a) preparing a lead frame having a plurality of device formation regions; (b) after the (a), mounting a plurality of semiconductor chips on the plural device formation regions of the lead frame; and (c) after the (b), sealing the plural semiconductor chips and one portion of the lead frame with a sealing resin.

Here, the (c) further comprises: (c1) disposing the lead frame, a mold having a main surface on which a plurality of cavity parts to be respectively arranged in the plural device formation regions are formed, the lead frame being disposed on the main surface of the heated mold; (c2) after the (c1), injecting a resin onto the main surface of the heated mold so as to seal the plural semiconductor chips and the one portion of the lead frame with the sealing resin; and (c3) after the (c2), taking out the lead frame from the heated mold. In the (c3), the main surface of the mold is inspected by using a sensor while the lead frame is taken out, and the sensor is cooled and formed integrally with an arm that takes out the lead frame.

In accordance with an embodiment, it is possible to provide a manufacturing method of a semiconductor device, which is capable of detecting any foreign matters and is suitable for mass-producing the semiconductor devices.

BRIEF DESCRIPTIONS OF THE DRAWINGS

FIG. 6A is a timing chart showing an operation of the molding device according to the first embodiment;

FIG. 6B is a timing chart showing an operation of the molding device according to the first embodiment;

FIG. 6C is a timing chart showing an operation of the molding device according to the first embodiment;

FIG. 6D is a timing chart showing an operation of the molding device according to the first embodiment;

FIG. 6E is a timing chart showing an operation of the molding device according to the first embodiment;

FIG. 6F is a timing chart showing an operation of the molding device according to the first embodiment;

FIG. 6G is a timing chart showing an operation of the molding device according to the first embodiment;

FIG. 6H is a timing chart showing an operation of the molding device according to the first embodiment;

FIG. 6I is a timing chart showing an operation of the molding device according to the first embodiment;

FIG. 6J is a timing chart showing an operation of the molding device according to the first embodiment;

FIG. 7 is a view showing a state of the molding device according to the first embodiment;

FIG. 8A is a view showing a state of the molding device according to the first embodiment;

FIG. 8B is a view showing a state of the molding device according to the first embodiment;

FIG. 9A is a view showing a state of the molding device according to the first embodiment;

FIG. 9B is a view showing a state of the molding device according to the first embodiment;

FIG. 10 is a view showing a state of the molding device according to the first embodiment;

FIG. 12 is a view showing a state of the molding device according to the first embodiment;

DESCRIPTIONS OF THE PREFERRED EMBODIMENTS

Figure 1:
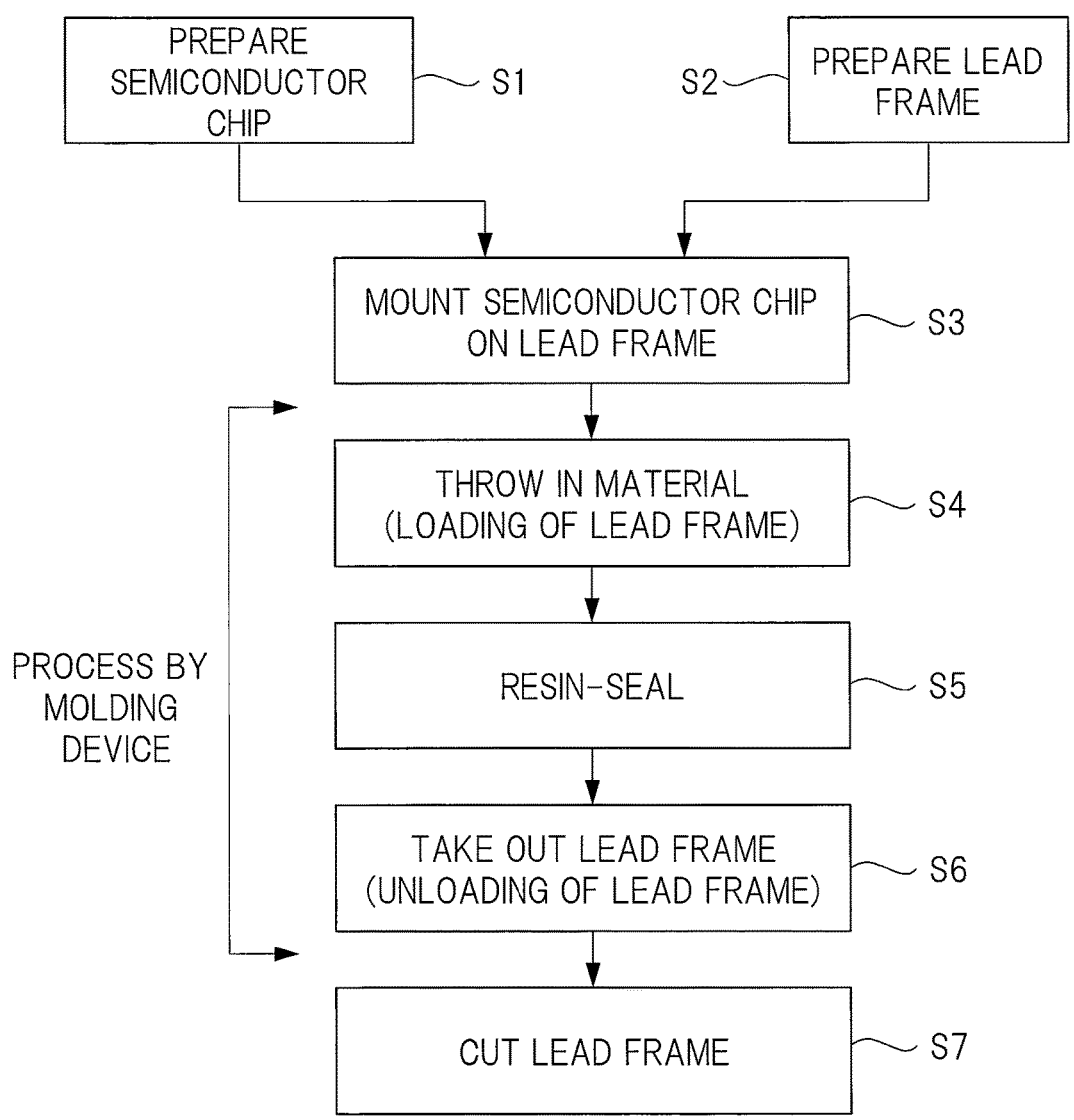
FIG. 1 is a flow chart showing a manufacturing method of a semiconductor device according to a first embodiment.

Hereinafter, embodiments of the present invention will be described in detail with reference to the accompanying drawings. Note that the disclosure is mere an example, and it is a matter of course that any alteration that is easily made by a person skilled in the art while keeping a gist of the present invention is included in the present invention. In addition, the drawings schematically illustrate a width, a thickness, a shape and the like of each portion as compared to actual aspects in order to make the description clearer, but the drawings are mere examples and do not limit the interpretation of the present invention.

In addition, the same reference characters are applied to the same elements as those described in relation to the foregoing drawings in the present specification and the respective drawings, and detailed descriptions thereof will be appropriately omitted in some cases.

First Embodiment

<Outline of Manufacturing Method of Semiconductor Device>

FIG. 1 is a flow chart showing a manufacturing method of a semiconductor device according to a first embodiment. In step (process) S1, a semiconductor chip on which a plurality of circuit blocks are formed by using a known semiconductor manufacturing technique is prepared. Moreover, in step S2, a lead frame on which the semiconductor chip prepared in step S1 is mounted is prepared. The lead frame to be prepared in step S2 is prepared as, for example, a sheet of lead frame integrally formed by a plurality of lead frames on each of which the semiconductor chip is mounted. In step S3, the semiconductor chip prepared in step S1 is mounted on the lead frame prepared in step S2, and bonding pads of the semiconductor chip and inner leads of the lead frames are electrically connected with one another by wires.

The lead frame on which the semiconductor chip prepared in step S3 is mounted is partially resin-sealed by a molding device having molds. A step (process) carried out by the molding device relating to the semiconductor device mainly includes the following three steps S4 to S6. That is, in step S4, the lead frame prepared in step S3 is thrown, as a material, in the molding device (material throwing-in). That is, the lead frame on which the semiconductor chip is mounted is inserted (loading of lead frame) between the upper mold and the lower mold forming the mold. In step S5 following step S4, while injecting a resin (a sealing resin), the lead frame is tightened by the upper and lower molds preliminarily heated, and one portion of the lead frame on which the semiconductor chip is mounted is resin-sealed. Moreover, in step S6 following step S5, the lead frame is taken out. That is, a space between the upper mold and the lower mold is widened, and the lead frame partially resin-sealed is taken out (unloading of lead frame).

The lead frame thus taken out is cut in step S7 so as to be a lead frame for each of the semiconductor chips, and a lead(s) is molded.

Next, explanation will be given to a flow chart shown in FIG. 1 by exemplifying a lead frame for QFP (Quad Flat Package). FIG. 2 is a perspective view showing a lead frame according to the first embodiment. Moreover, FIG. 3 is a perspective view showing an after-resin-sealing lead frame and an after-resin-sealing semiconductor device according to the first embodiment.

Figure 2A:
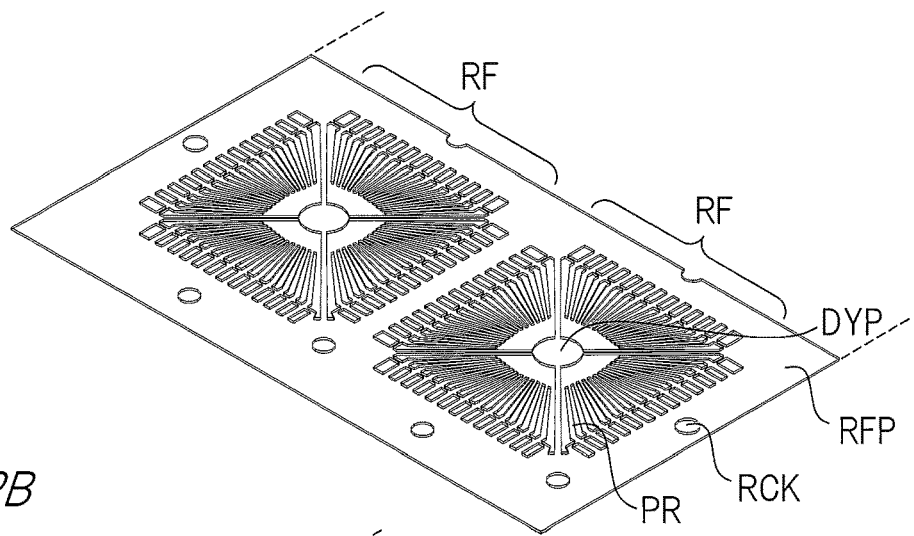
FIG. 2A is a perspective view showing a lead frame according to the first embodiment.

FIG. 2A is a perspective view showing the lead frame prepared in step S2. In the same drawing, the reference numeral "DYP" indicates a die part (device formation region) on which a semiconductor chip CHP (FIG. 2B) prepared in step S1 is mounted. In a manner so as to surround the die part DYP, a lead part PR is disposed so that a lead frame RF corresponding to one semiconductor chip CHP is formed. A plurality of lead frames RF corresponding to each semiconductor chip CHP are formed on one metal plate so that an integral lead frame RFP is formed. As will be explained later, a portion RCK opened in the lead frame RFP indicates a portion into which a frame chuck part provided to a loader and an unloader (hereinafter, referred to also as an "arm") is inserted when the lead frame RFP is placed in and taken out of the mold.

Figure 2B:
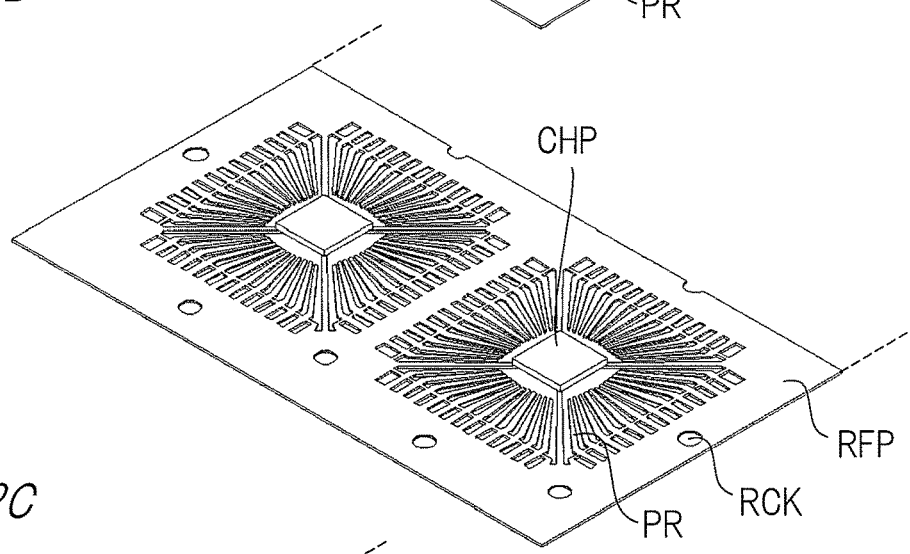
FIG. 2B is a perspective view showing the lead frame according to the first embodiment.
Figure 2C:
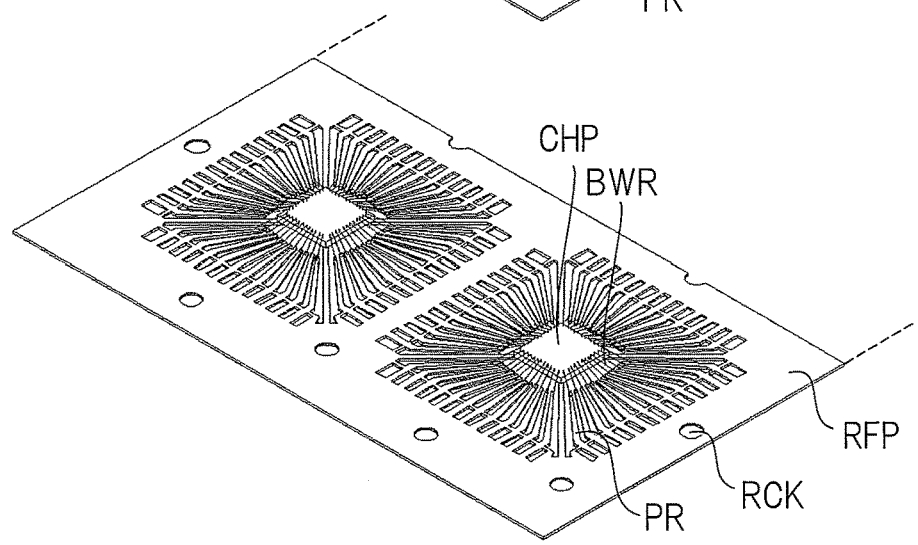
FIG. 2C is a perspective view showing the lead frame according to the first embodiment.

FIG. 2B shows a state in which the semiconductor chip CHP prepared in step S1 is mounted on each of the die parts DYP of the lead frame RF. FIG. 2C shows a state in which, in step S3, bonding pads (not shown) of the semiconductor chip CHP and inner lead parts of the lead parts PR are electrically connected to one another by wires BWR.

Figure 3A:
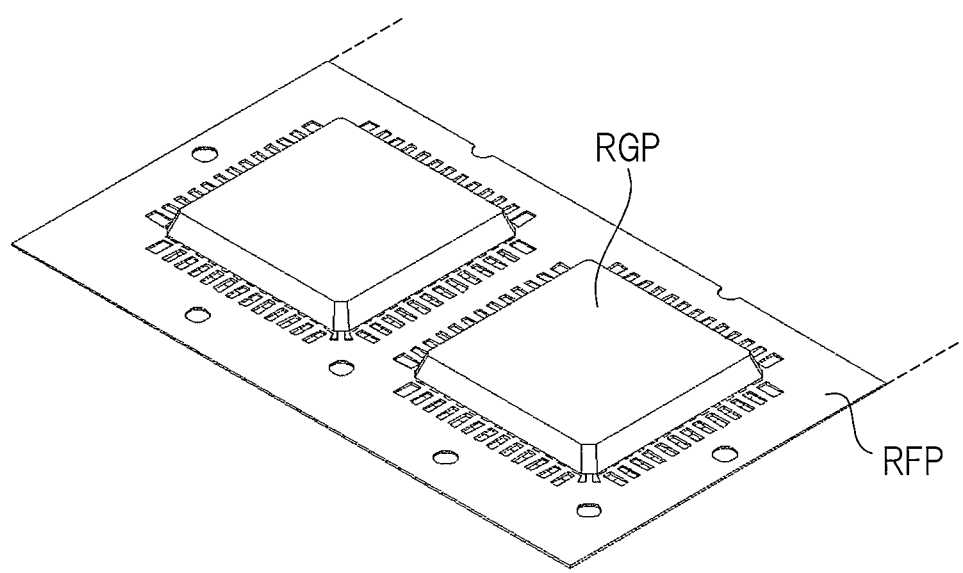
FIG. 3A is a view showing an after-resin-sealing lead frame according to the first embodiment.
Figure 3B:
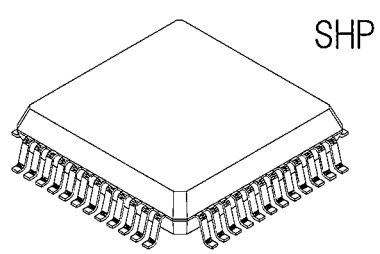
FIG. 3B is a view showing an after-resin-sealing semiconductor device according to the first embodiment.

The lead frame in the state shown in FIG. 2C is loaded into the mold in step S4, and resin-sealed in step S5, and is then unloaded from the mold in step S6. FIG. 3A is a perspective view showing the lead frame RFP unloaded. In the same drawing, the reference numeral "RGP" shows a sealed resin by which the semiconductor chip CHP and the inner lead part are sealed. In step S7, the lead frame RF corresponding to the semiconductor chip CHP is cut out from the lead frame RFP shown in FIG. 3A, and an outer lead part is molded so that a semiconductor device SHP shown in FIG. 3B is formed.

Figure 4A:
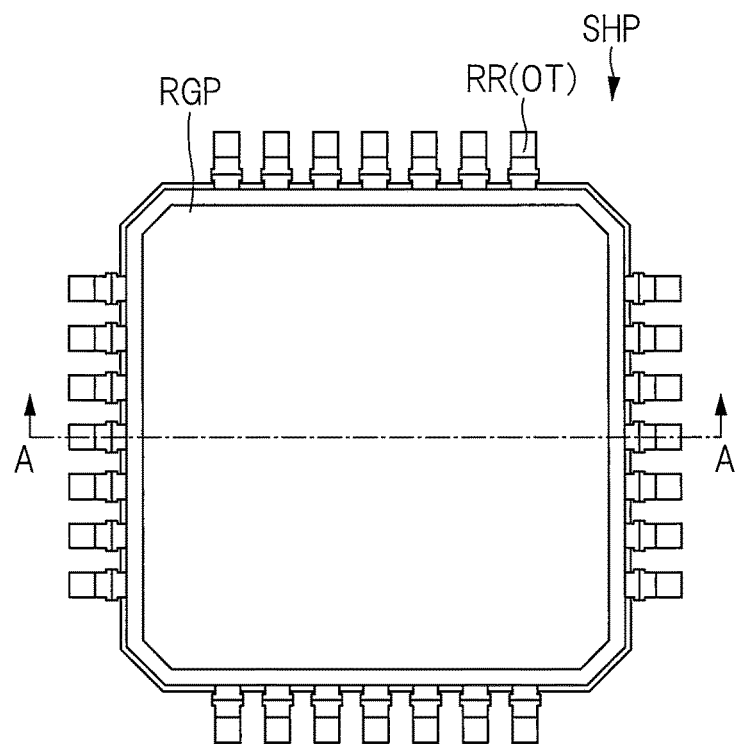
FIG. 4A is a view showing a configuration of a semiconductor device according to the first embodiment.
Figure 4B:
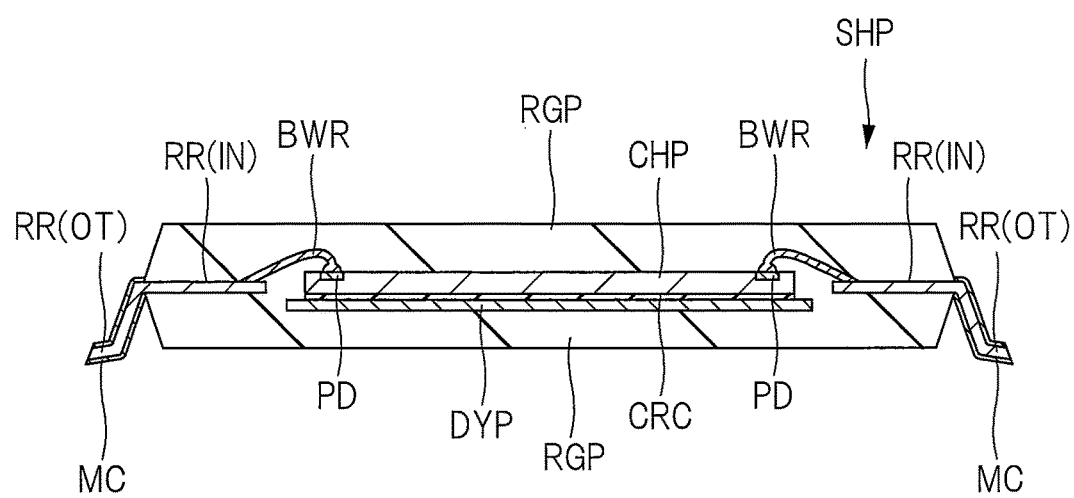
FIG. 4B is a view showing a configuration of the semiconductor device according to the first embodiment.

FIG. 4A and FIG. 4B are views showing a configuration of the semiconductor device SHP according to the first embodiment. FIG. 4A is a plan view showing the semiconductor device SHP, and FIG. 4B is a cross-sectional view showing an A-A cross-section in the plan view of FIG. 4A. As shown in FIG. 4B, sealed with a sealing resin GRP are: the inner lead parts PR(IN) out of the lead parts PR forming the lead frame RF; the die part DYP; and the semiconductor chip CHP mounted on the die part DYP. Moreover, wires BWR that connect the bonding pads PD of the semiconductor chip CHP and the inner lead parts RR(IN) with one another are also sealed with the sealing resin RGP. In FIG. 4B, the reference numeral "CRC" indicates a connection layer for connecting the die part DYP and the semiconductor chip CHP to each other.

The reference numeral "MC" indicates a plating layer coated onto an outer lead part RR(OT). The outer lead part RR(OT) is molded in a bent state as shown in FIG. 4B. In this case, since the QFP is exemplified, the outer lead parts RR(OT) protrude from each of four sides of a package formed by the sealing resin RGP, as shown in FIG. 4A.

<Outline of Sealing Step>

Next, explanation will be given to operations carried out at a time of partially resin-sealing the lead frame RFP by the molding device. As explained in FIG. 2, the lead frame RFP is formed by the plurality of lead frames RF corresponding to each of the semiconductor chips CHP. However, in this case, the explanation will be given by exemplifying one of the lead frames RF.

Figure 5:
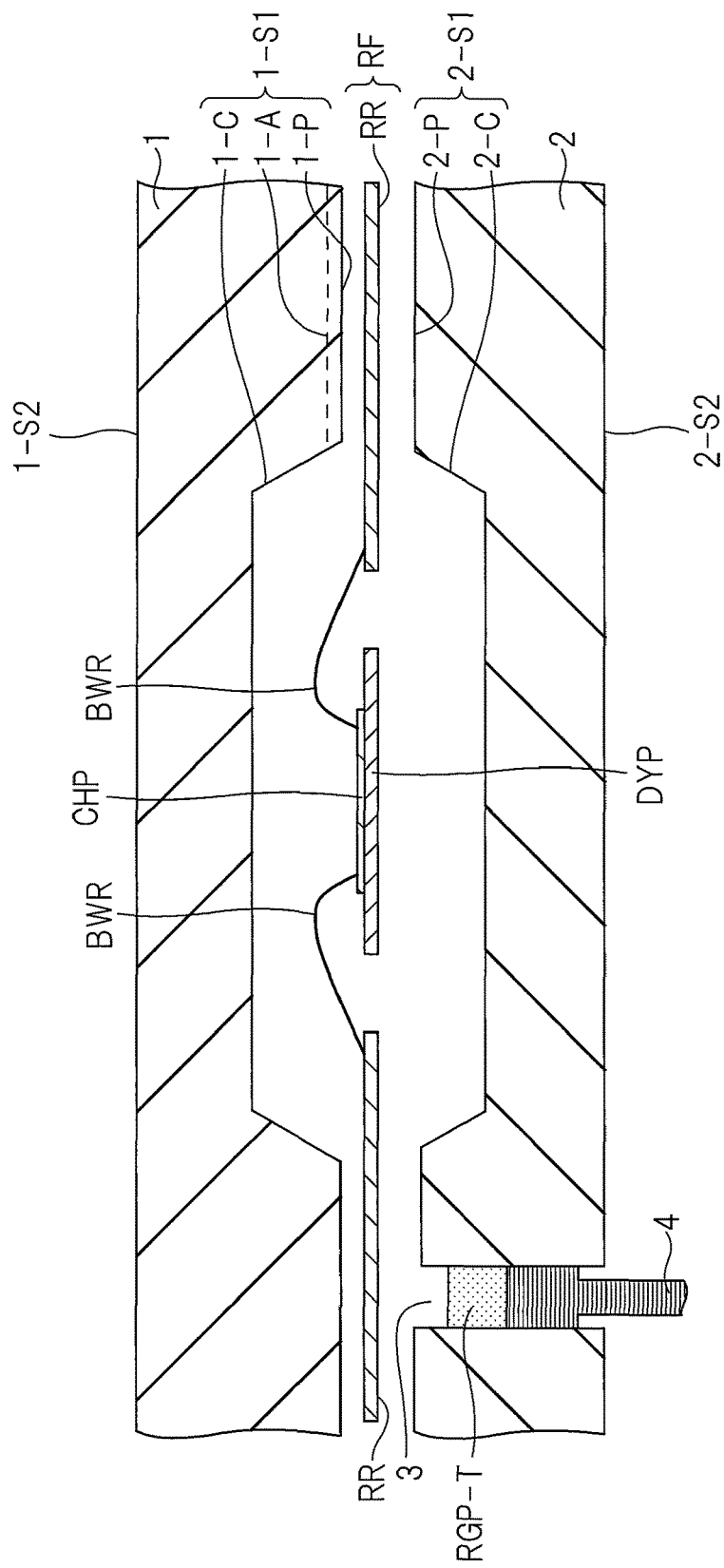
FIG. 5 is an explanatory diagram for explaining resin-sealing according to the first embodiment.

FIG. 5 is an explanatory diagram for explaining resin-sealing according to the first embodiment. In the same drawing, the reference numerals "1" and "2" represent molds that the molding device has. In this case, the reference numeral "1" indicates an upper mold and "2" indicates a lower mold. In the present specification, with respect to a vertical direction, the mold placed on a lower side is referred to as a lower mold, and the mold placed on an upper side is referred to as an upper mold.

The upper mold 1 is provided with a main surface 1-S1 and a rear surface 1-S2 opposite to the main surface 1-S1. In the same manner, the lower mold 2 is also provided with a main surface 2-S1 and a rear surface 2-S2 opposite to the main surface 2-S1. The upper mold 1 and the lower mold 2 are disposed so that the main surface 1-S1 of the upper mold 1 and the main surface 2-S1 of the lower mold 2 oppose each other (face to face with each other). Moreover, although omitted from the same drawing, the rear surface 1-S2 of the upper mold 1 and the rear surface 2-S2 of the lower mold 2 are respectively coupled to a presser. At a time of tightening the lead frame RF, the upper mold 1 and the lower mold 2 are moved by the presser so as to make a gap between the upper mold 1 and the lower mold 2 narrower and so that a parting surface 1-P on the main surface 1-S1 of the upper mold 1 and a parting surface 2-P on the main surface 2-S1 of the lower mold 2 abut on each other via the lead frame RF. On the other hand, at a time of taking out the lead frame RF, the upper mold 1 and the lower mold 2 are moved by the presser so as to widen a gap between the main surface 1-S1 and the main surface 2-S1.

Moreover, the upper mold 1 and the lower mold 2 are always heated by a not-shown heating device, and are always kept at, for example, 180° C.

Formed on the main surface 1-S1 of the upper mold 1 is a cavity part 1-C adjusted to an outer shape of a package. Moreover, in the first embodiment, an air vent 1-A coupled to the cavity part 1-C is formed on one portion of the main surface 1-S1 of the upper mold 1. That is, formed on the main surface 1-S1 are the cavity part 1-C, the parting surface 1-P, and the air vent 1-A.

Also formed on the main surface 2-S of the lower mold 2 is a cavity part 2-C adjusted to an outer shape of the package. Moreover, in the first embodiment, formed in the main surface 2-S1 of the lower mold 2 is an opening for a pod 3. That is, formed on the main surface 2-S are the cavity part 2-C, the parting surface 2-P, and the opening for the pod 3.

At a time of sealing one portion of the lead frame RF with resin, as shown in FIG. 5, the lead frame RF is disposed between the upper mold 1 and the lower mold 2 so that a tab part DYP and the inner lead part mounting the semiconductor chip CHP are housed in the cavity parts 1-C and 2-C. Thereafter, the upper mold 1 and the lower mold 2 are moved by using the presser so that the parting surface 1-P of the main surface 1-S1 and the parting surface 2-P of the main surface 2-S1 abut on each other via the lead frame RF. At this time, a resin tablet RGP-T is thrown in the pod 3 and, in the same drawing, a plunger 4 is pushed to the upper side from the lower side along the vertical direction. The resin tablet RGP-T is dissolved by the upper mold 1 and the lower mold 2 heated, and injected into a space formed by the cavity parts 1-C and 2-C to be filled with a resin. Thus, the semiconductor chip CHP and the inner lead part are sealed with the resin. Incidentally, excessive air caused by the injection of the resin is discharged through the air vent 1-A.

After the sealing with the resin, the gap between the upper mold 1 and the lower mold 2 are widened by the presser so that the lead frame RF partially sealed with the resin is taken out.

In this case, explanation has been given by exemplifying the lead frame RF corresponding to the semiconductor chip CHP. However, the same is true also for the lead frame RFP in which the plurality of lead frames RF are integrally formed.

When the resin remains on the main surface 1-S1 or/and 2-S1 after the lead frame RFP partially resin-sealed has been taken out, the remaining resin becomes resin waste. In this case, the resin waste remaining on the main surface 1-S1 drops down, by gravity, onto the main surface 2-S1 of the lower mold 2 disposed on the lower side in the vertical direction. For this reason, the resin waste remains on the main surface 2-S1 in most cases.

<Operations of Molding Device>

Next, explanation will be given to operations of the molding device. Since a process of step S4 and S5 shown in FIG. 1 is executed by the operations of the molding device, the operations to be explained below may be regarded as explanation of a process about a manufacturing method of the semiconductor device SHP.

The molding device includes the upper mold, the lower mold, a presser, a loader, an unloader, a driving mechanism coupled to the loader and the unloader, and a control unit, etc. These parts constituting the molding device will be explained in later-explaining the operations of the molding device.

FIG. 6 is a timing chart showing the operations of the molding device according to the first embodiment. A horizontal axis in FIG. 6 indicates time. FIG. 6A shows a state of the entire molding device, and FIG. 6B shows a state of the mold (upper mold and lower mold) that the molding device has. FIG. 6C to FIG. 6I indicate timing relating to the unloading of the lead frame to be executed in step S6 of FIG. 1. Moreover, FIG. 6J indicates an amount of wind of dry air to be used for cooling a sensor explained later. First, referring to FIG. 6A and FIG. 6B, explanation will be given up to the loading (step S4 in FIG. 1) of the lead frame and the resin-sealing (step S5 of FIG. 1), and thereafter the unloading (step S6 of FIG. 1) will be explained.

In the first embodiment, a detection as to whether or not any foreign matters are present on the lower mold is carried out. When no foreign matters are detected, the molding device repeatedly performs the same operations. That is, the same operations are repeated cyclically. FIG. 6 shows a current cycle, and one portion of a next cycle following the current cycle.

<<Loading of Lead Frame>>

The current cycle is started at time t0 prior to time t1. During a period from time t0 to time t1, the molding device becomes a "material throwing-in" state and a "resin-sealing" state. That is, the "material loading" state that is almost the same as the "material throwing-in" state indicated as a part of the next cycle in FIG. 6 is started at time t0, and thereafter the "resin-sealing" state indicated as the current cycle in FIG. 6 continues until time t1. The "material throwing-in" state corresponds to the loading of the lead frame. Referring to FIG. 7 to FIG. 10, the "material throwing-in" state will be explained. FIG. 7 to FIG. 10 are views that show states of the molding device 10 according to the first embodiment.

In the "material throwing-in" state of the current cycle, the molding device becomes a state shown in FIG. 7. In FIG. 7, the upper mold 1 and the lower mold 2 have the same structures as those explained in FIG. 5. Omitted from FIG. 7 in order to avoid complexity of the drawing are the air vent 1-A, the pod 3, the resin tablet 3, and the plunger 4. In the drawings shown thereafter, the upper mold 1 and the lower mold 2 have the same structures as those of FIG. 5. However, the air vent 1-A, the pod 3, the resin tablet 3 and the plunger 4 are omitted in the same manner as in FIG. 7.

Moreover, in FIG. 7, the reference numeral "1-L" indicates a first end of the upper mold 1, and "1-F" indicates a second end of the upper mold 1. As shown in the same drawing, a plurality of cavity parts 1-C are formed between the first end 1L and the second end 1-F on the main surface 1-S1. In FIG. 7, the reference numeral "2-L" indicates a first end of the lower mold 2, and "2-F" indicates a second end of the lower mold 2. In the same manner as in the main surface 1-S1, a plurality of cavity parts 2-C are formed between the first end 2-L and the second end 2-F on the main surface 2-S1.

Incidentally, in FIG. 7, the reference numeral "IR" indicates a foreign matter. When the resin waste remains in the cycle prior to the current cycle shown in FIG. 6, FIG. 7 shows that the resin waste remains on the parting surface 2-P or/and the cavity part 2-C on the main surface 2-S1 and becomes foreign matters.

The molding device 10 has a loader 11. The loader 11 has a main surface 11-S1, a rear surface 11-S2 opposite to the main surface 11-S1, a first end 11-L, and a second end 11-F. The loader 11 is provided with a plurality of frame chuck parts PCT that are on the main surface 11-S1 between the first end 11-L and the second end 11-F. The loader 11 is coupled to a not-shown driving mechanism, and driven by the driving mechanism to advance in a direction indicated by "front" (←forward) or retreat in a direction indicated by "back" (→backward) in the same drawing.

In the "material throwing-in" state, the lead frame RFP (FIG. 2A to FIG. 2C) mounting the semiconductor chip CHP on each of the die parts DYP is attached onto the main surface 11-S1 of the loader 11. That is, the lead frame FRP shown in FIG. 2C is attached onto the main surface 11-S1. In this case, although not particularly limited, the frame chuck part PCT is inserted to the opening RCK of the lead frame RFP shown in FIG. 2C, and the lead frame RFP is fixed.

In the "material throwing-in" state, as shown in FIG. 6B, the gap between the upper mold 1 and the lower mold 2 is widened (opened). The loader 11 advances by the driving mechanism coupled to the loader 11, and inserted into a space between the upper mold 1 and the lower mold 2. That is, the loader 11 is inserted so that the rear surface 11-S2 of the loader 11 faces the main surface 1-S1, and also to make the main surface 11-S1 of the loader 11 face to face with the main surface 2-S1. The advance of the loader 11 is carried out by making the second end 11-F of the loader 11 move from the first ends 1-L and 2-L of the upper mold 1 and the lower mold 2 toward the second ends 1-F and 2-F thereof. In this case, the loader 11 moves so that the loader 11 comes in no contact with the upper mold 1 and the lower mold 2, the rear surface 11-S2 of the loader 11 and the parting surface 1-P are parallel with each other, and the main surface 11-S1 of the loader 11 and the parting surface 2-P are parallel with each other.

FIG. 8 shows a state in which the loader 11 in the "material throwing-in" state is inserted into a space between the upper mold 1 and the lower mold 2, and has reached a predetermined position. FIG. 8A is a cross-sectional view showing cross-sections of the upper mold 1, the lower mold 2, and the loader 11, and FIG. 8B is a plan view seen from above the upper mold 1. The above-mentioned predetermined position corresponds to a position where the die part DYP and the inner lead part RR(IN) in each of the lead frames RF constituting the lead frame RFP fall within the cavity parts 1-C and 2-C as shown in FIG. 8B, in a plan view. In other words, the lead frame RFP moves so that the die part DYP and the inner lead part RR(IN) in the lead frame RF are arranged at positions corresponding to the cavity parts 1-C and 2-C.

When the loader 11 has reached the predetermined position, the lead frame RFP fixed onto the loader 11 by the frame chuck part PCT is separated from the frame chuck part PCT. Thus, as shown in FIG. 9, the lead frame RFP is disposed on the main surface 2-S1 of the lower mold 2. FIG. 9A is a cross-sectional view showing cross-sections of the upper mold 1, the lower mold 2, and the loader 11, and FIG. 9B is a plan view seen from above the lower mold 2. In this case, the die part DYP and the inner lead part RR(IN) in each of the lead frames RF are disposed so as to fall within the cavity part 2-C, as shown in FIG. 9B.

As shown in FIG. 9, when the lead frame RFP has been mounted on the main surface 2-S1 of the lower mold 2, the loader 11 moves in a "backward" direction. That is, the loader 11 retreats. When attention is focused on the second end 11-F of the loader 11, the second end 11-F moves from the second ends 1-F and 2-F of the upper mold 1 and the lower mold 2 toward the first ends 1-L and 2-L, and further moves up to outsides of the first ends 1-L and 2-L. When the rear surface 1-S2 of the upper mold 1 is seen from above in the plan view, the loader 11 moves till the outsides of the molds (upper mold 1 and lower mold 2). Thus, as shown in FIG. 10, the loader 11 is taken out from between the upper mold 1 and the lower mold 2.

As described above, the lead frame RFP mounting the plural semiconductor chips CHP is disposed at the predetermined position of the lower mold 2.

<<Resin Sealing>>

Figure 11:
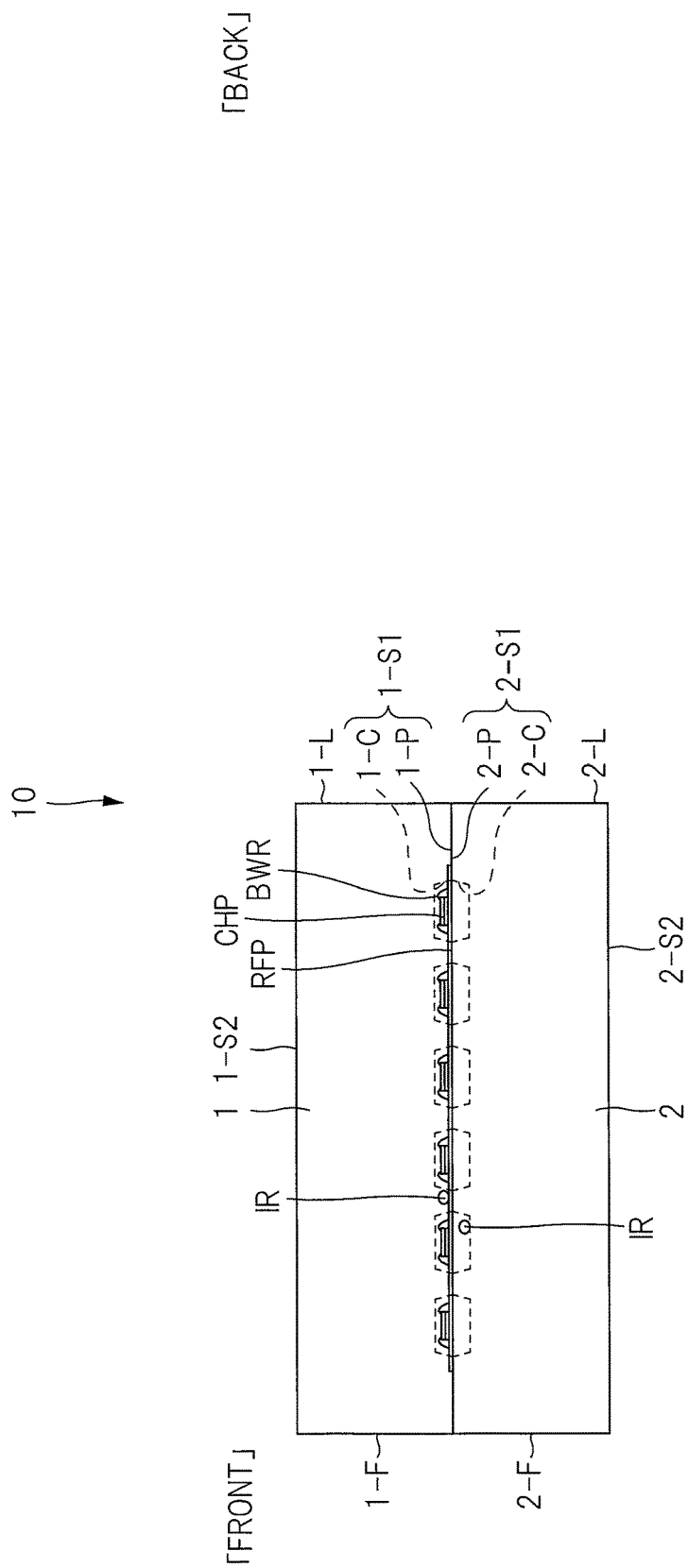
FIG. 11 is a view showing a state of the molding device according to the first embodiment.

Next, referring to FIG. 11 and FIG. 12, the following description will be made about the "resin-sealing" state. FIG. 11 and FIG. 12 are views each showing a state of the molding device 10 according to the first embodiment.

When the "material throwing-in" state has been completed and transitions to the "resin-sealing" state, the lead frame RFP is tightened (mold-clamping) by the molds (upper mold 1 and lower mold 2). That is, the molds are moved by the not-shown presser so as to narrow the gap between the upper mold 1 and the lower mold 2 that opened as shown in FIG. 10. Thus, as shown in FIG. 11, the parting surface 1-P of the upper mold 1 and the parting surface 2-P of the lower mold 2 abut on each other so that the lead frame RFP is tightened by the upper mold 1 and the lower mold 2.

Although not particularly limited, the resin tablet RGP-T shown in FIG. 5 is thrown in the pod 3 when being in the state shown in FIG. 11. Thus, as explained in FIG. 5, the resin RGP is injected to the respective cavity parts, the tab part DYP and the inner lead part RR(IN) that mount the semiconductor chip CHP are sealed with the resin RGP to lead to a state shown in FIG. 12.

As described above, predetermined portions of the lead frame RFP lead to a state of being partially sealed with the resin RGP. If the foreign matters IR are present on the main surface 2-S1 of the lower mold 2 in the "resin-sealing" state, the air vent may be blocked for example. Moreover, if the foreign matters IR are present in the cavity part 2-C, they mix in the injected resin RGP or/and adhere to the molded resin RGP to cause deformation of the wire BWR (FIG. 5B).

<<Unloading of Lead Frame>>

Next, explanation will be given to the unloading of the lead frame to be executed in step S6 explained in FIG. 1. In FIG. 6, it is executed from time t1 to time t3, and the state of the molding device 10 in FIG. 6A corresponds to a state of "take out load frame resin-sealed" (hereinafter, referred to also as a "lead frame taking-out" state).

In the present embodiment, an operation for cleaning the foreign matters IR present on the main surface 2-S1 of the lower mold 2 is carried out in the "lead frame taking-out" state. The cleaning is executed by sucking air from the main surface 2-S1 of the lower mold 2 toward he main surface 1-S1 of the upper mold 1. That is, the cleaning is carried out by dust-collecting the foreign matters IR present on the main surface 2-S1 by the suction. Therefore, used as a cleaning mechanism for carrying out the cleaning is, for example, a suction device or a dust collector.

Moreover, in the present embodiment, made is a detection as to whether or not the foreign matters IR remain on the main surface 2-S1 that has been cleaned. This foreign matter detection is also carried out in the "lead frame taking-out" state. In the present embodiment, the main surface 2-S1 of the lower mold 2 is photographed by a sensor or a camera, and the detection as to whether or not the foreign matters IR remain is carried out based upon data of an image(s) photographed.

Next, explanation will be given with reference to FIG. 13 to FIG. 18, and the unloader for taking out the lead frame from the molds, the cleaning mechanism for cleaning the mold and the sensor are integrally formed in the present embodiment. Thus, the taking-out of the lead frame, and the cleaning and the detection of the foreign matters can be carried out temporally parallel, which makes it possible to shorten time required for manufacturing the semiconductor device SHP. Additionally, in order to photograph the image of the main surface 2-S1, the sensor needs to be close to the upper mold 1 and the lower mold 2 heated. Therefore, since the sensor is placed in a high-temperature state, it is considered that its characteristics deteriorate or/and its life cycle shortens. However, in the first embodiment, since the sensor is cooled by a cooling mechanism, it is possible to suppress the deterioration in the characteristics or/and the shortening of the life cycle even if the sensor is placed close to the upper mold 1 and the lower mold 2 heated.

FIG. 13 is a structural view showing a structure of a composite unit in which the unloader, the cleaning mechanism, and the sensor are integrally formed. Moreover, FIG. 14 to FIG. 18 are views each showing a state of the molding device 10 according to the first embodiment.

<<<Composite Unit>>>

Figure 13A:
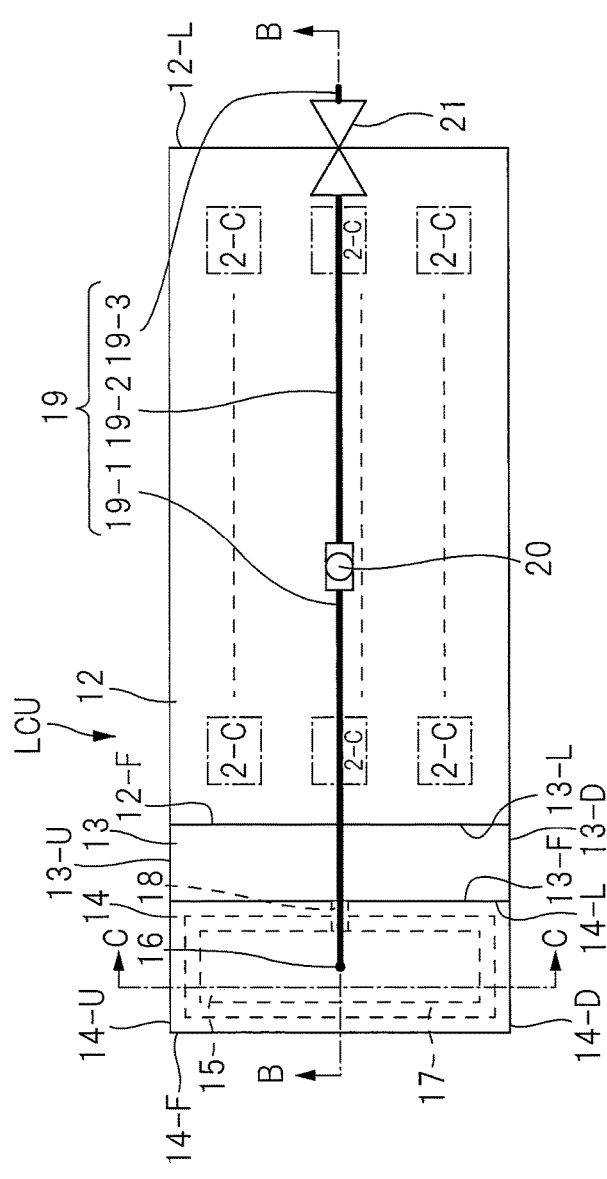
FIG. 13A is a view showing a structure of a composite unit relating to the first embodiment.
Figure 13B:
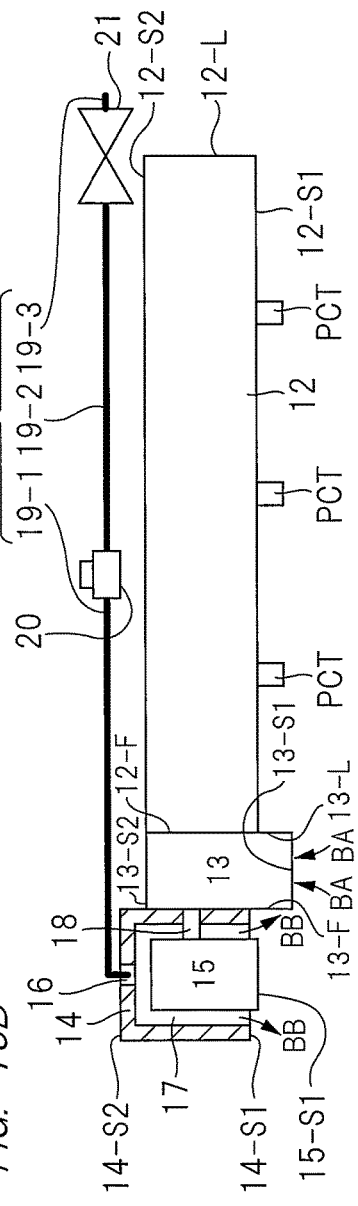
FIG. 13B is a view showing a structure of the composite unit relating to the first embodiment.
Figure 13C:
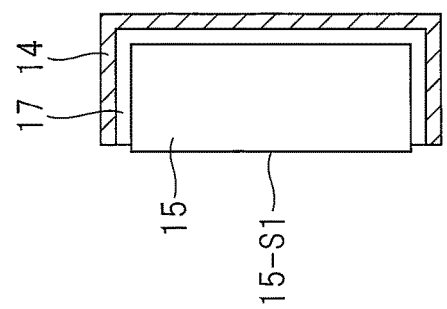
FIG. 13C is a view showing a structure of the composite unit relating to the first embodiment.

FIG. 13A is a plan view showing a composite unit LCU, FIG. 13B is a cross-sectional view showing a B-B cross section in FIG. 13A, and FIG. 13C is a cross-sectional view showing a C-C cross section in FIG. 13A.

The composite unit LCU has an unloader (arm) 12, a cleaning mechanism 13, and a sensor 15 housed in a cover housing 14. When seen in a plan view, an outer shape of the unloader 12 is a rectangular box shape. An end corresponding to one short side of the rectangular shape is set as a first end 12-L of the unloader 12, and an end corresponding to the other short side is set as a second end 12-F of the unloader 12. A bottom surface of the box is set as a main surface 12-S1 of the unloader 12, and an upper surface thereof is set as a rear surface 12-S2 of the unloader 12. Since the unloader has the box shape, the first end 12-L and the second end 12-F are positioned at mutually opposite sides, and the main surface 12-S1 and the rear surface 12-S2 are also positioned at mutually opposite sides. A plurality of frame chuck parts PCT are provided between the first end 12-L and the second end 12-F on the main surface 12-S1 of the unloader 12 in the same manner as in the loader 11.

Onto a second end 12-F side of the unloader 12, a cleaning mechanism 13 is attached. The cleaning mechanism 13 according to the first embodiment has a box-shaped housing provided with a main surface 13-S1, a rear surface 13-S2, and four side faces 13-L, 13-U, 13-D, and 13-F. Here, the main surface 13-S1 is an opening face that is kept opened, and the rear surface 13-S2 is coupled to a dust collector (not shown) through a pipe. When air suction is started by the dust collector, air is sucked in an arrow direction of BA from the opening face of the cleaning mechanism 13 so that foreign matters are also sucked in the BA direction together with air. The side face 13-L of the cleaning mechanism 13 is attached to the second end 12-F of the unloader 12 and is fixed thereon.

An outer shape of a cover housing 14 is also a box shape, and the cover housing has a main surface 14-S1, a rear surface 14-S2, and four side faces 14-L, 14-F (side face opposite to the side face 14-L), 14-U, and 14-D (side face opposite to the side face 14-U). The main surface 14-S1 is an opening face that is kept opened, and the rear surface is provided with an opening 16 that is coupled to a pipe. The side face 14-L of the cover housing 14 is attached to the side face 13-F of the cleaning mechanism 13, and the cover housing 14 is fixed onto the cleaning mechanism 13. Moreover, the opening 16 is coupled to a pipe 19, and the pipe 19 is coupled to a dry air source (not shown) in a factory for manufacturing a semiconductor device, the molding device 10 being installed in the factory. In the first embodiment, the pipe 19 is constituted by three pipe units 19-1 to 19-3. Installed between the pipe units 19-1 and 19-2 is a flow-rate adjusting valve 20 for adjusting a flow rate of air (dried air: hereinafter, referred to also as "dry air") to be supplied to the cover housing 14 is installed. Installed between the pipe units 19-2 and 19-3 is an open/close valve 21 for stopping/starting the supply of dry air to the cover housing 14.

Since dry air is sent from the dry air source to the cover housing 14 by opening the open/close valve 21, the dry air is discharged in an arrow direction of BB from the opening face 14-S1 of the cover housing 14. Moreover, by the flow-rate adjusting valve 20, the flow rate of the dry air to be discharged from the opening face 14-S1 can be adjusted.

The sensor 15 is disposed inside the cover housing 14. In the present embodiment, the sensor 15 is composed of a line sensor. The line sensor (sensor) 15 is attached to the side face 13-F of the cleaning mechanism 13 by an attachment metal fitting 18 penetrating the side face 14-L of the cover housing 14, and is fixed thereon. That is, the cover housing 14 and the sensor 15 are disposed on the second end 12-F side of the unloader 12 so as to sandwich the cleaning mechanism 13, and are fixed thereon. The cleaning mechanism 13, the cover housing 14, and the sensor 15 are fixed onto the unloader 12, the cleaning mechanism 13, the cover housing 14, and the sensor 15 are also integrally moved when the unloader 12 is moved. That is, the unloader 13, the cleaning mechanism 13, the cover housing 14, and the sensor 15 which form the composite unit LCU are integrally formed and integrally moved.

Although explained with reference to FIG. 14 to FIG. 18, the composite unit LTC advances, is inserted into a space between the upper mold 1 and the lower mold 2, and then retreats when being in the "lead frame taking-out" state. The main surface 12-S1 of the unloader 12, the main surface (opening face) 13-S1 of the cleaning mechanism 13, the main surface (opening face) 14-S1 of the cover housing 14, and a photographing surface 15-S1 of the sensor 15 face the main surface 2-S1 of the lower mold 2 in a state where the composite unit LCU is inserted between the molds. For this reason, the opening face 13-S1 of the cleaning mechanism 13 carries out the suction in the direction (BA) from the main surface 2-S1 of the lower mold 2 toward the main surface 1-S1 of the upper mold 1 so as to collect dusts. On the other hand, the opening face 14-S1 of the cover housing 14 carries out a discharge of dry air in the direction (BB) from the main surface 1-S1 of the upper mold 1 toward the main surface 2-S1 of the lower mold 2.

In the present embodiment, as shown in FIG. 13B, the opening face 14-S1, the photographing surface 15-S1, and the opening face 13-S1 become lowered in this order. For this reason, when the composite unit LCU is disposed on the lower mold 2, the opening face 13-S1 becomes closest to the main surface 2-S1, the photographing surface 15-S1 becomes next closest thereto, and the opening face 14-S1 becomes farthest therefrom. This makes it possible efficiently dust-collect the foreign matters IR. Moreover, since dry air flows through a space 17 surrounding the sensor 15 and is discharged from the opening face 13-S1, the flowing dry air suppresses a rise of temperature of the sensor 15 and can cool the sensor.

In FIG. 13A, a plurality of blocks 2-C indicated by broken lines show the cavity parts when the composite unit LCU is disposed on the lower mold 2. For example, since FIG. 7 shows the upper mold 1 and the lower mold 2 by schematic cross-sections, the cavity parts 1-C and 2-C are indicated as one row. However, as shown in FIG. 8B, FIG. 9B, and FIG. 13A, the cavity parts 1-C and 2-C are respectively disposed in a matrix shape when seen in a plan view on the main surface 1-S1 of the upper mold 1 and the main surface 2-S1 of the lower mold 2. Moreover, the cleaning mechanism 13 simultaneously carries out dust-collection to the plural cavity parts 2-C formed in a column direction in FIG. 13A. In the same manner, the line sensor 15 simultaneously carries out photography to the plural cavity parts 2-C formed in the column direction.

<<<Taking-Out of Lead Frame>>>

Next, referring to the FIG. 6 again, explanation will be given to the "lead frame taking-out" state in which the above-mentioned composite unit LCU is used. FIG. 6C is a view showing a state of the above-mentioned composite unit LCU. In FIG. 6C, the composite unit LCU advances between time t1 and time t2, and carries out a lead frame chuck. Moreover, FIG. 6J shows a flow rate of dry air to be discharged from the opening face 14-S1 of the cover housing 14 toward the main surface 2-S1 of the lower mold 2. By adjusting the flow-rate adjusting valve 20 between time t1 and time t2, the flow rate of dry air to be discharged from the opening face 14-S1 is made small (slight wind).

Figure 14:
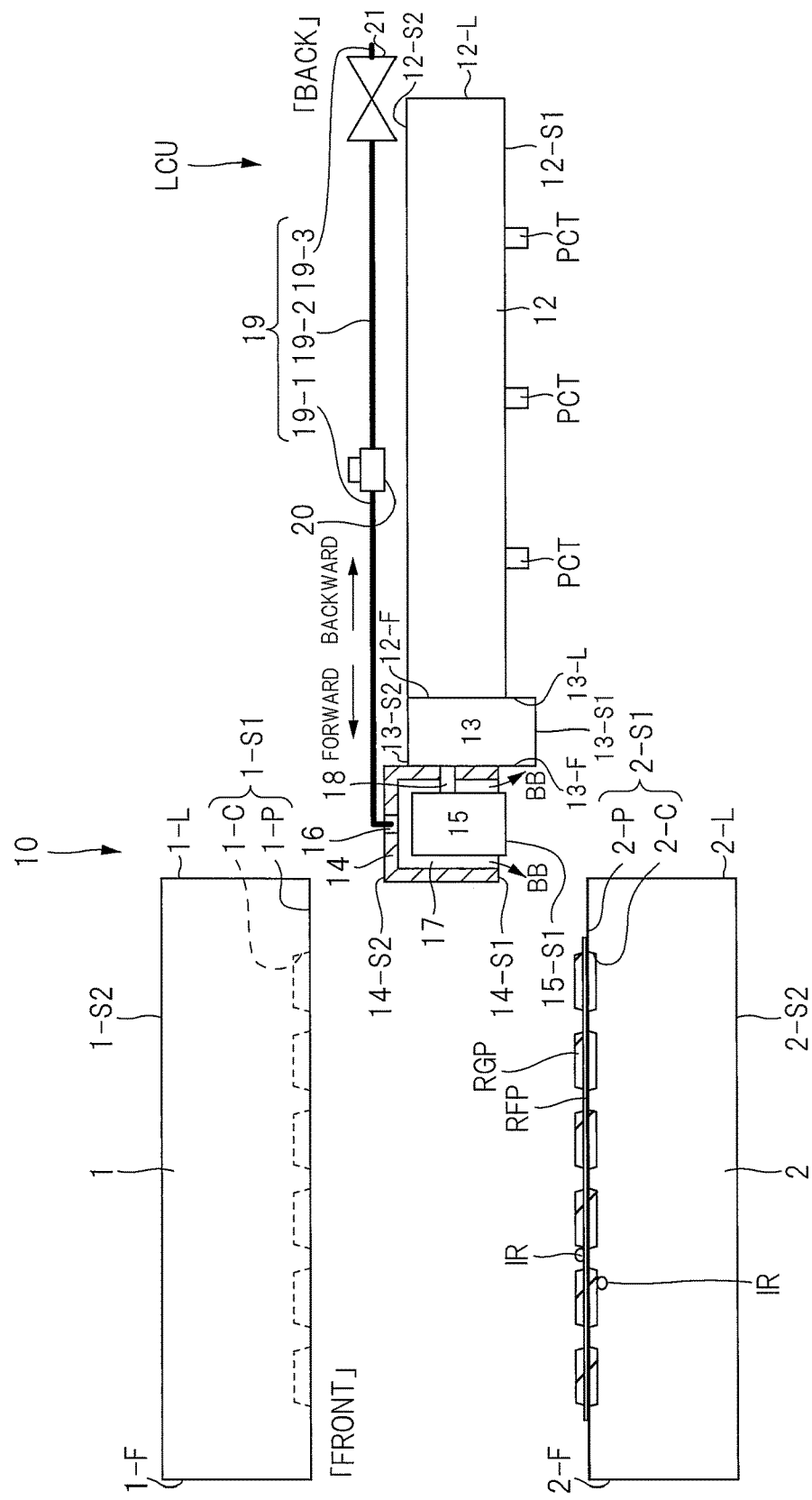
FIG. 14 is a view showing a state of the molding device according to the first embodiment.
Figure 15:
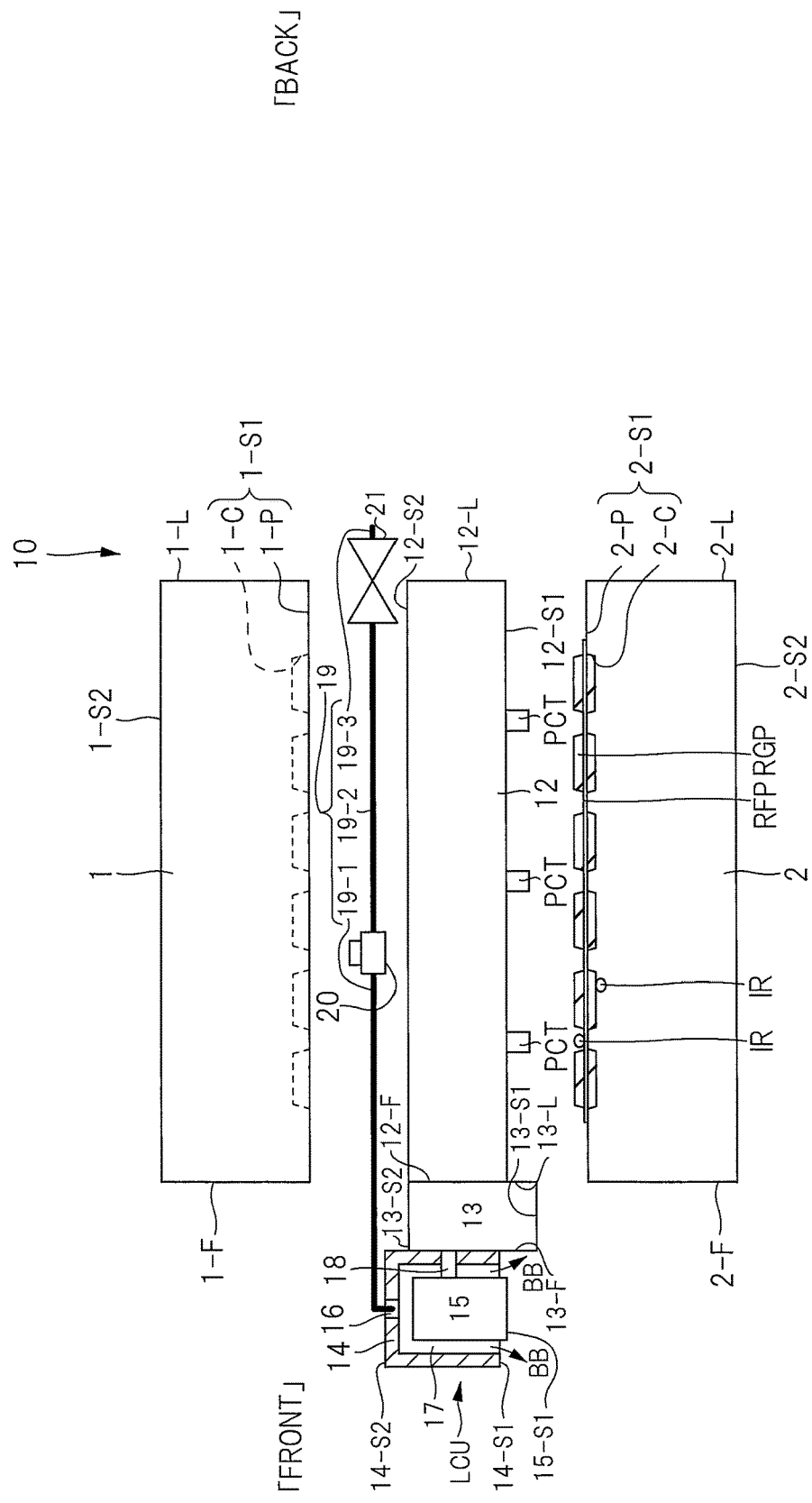
FIG. 15 is a view showing a state of the molding device according to the first embodiment.

Referring to FIG. 14 and FIG. 15, explanation will be given to advance of the composite unit LCU. FIG. 14 shows a state in which the composite unit LCU starts to advance. As shown in FIG. 6A and FIG. 6B, when the composite unit becomes the "lead frame taking-out" state, the molds are opened. That is, the gap between the upper mold 1 and the lower mold 2 is widened. Thus, in a state where the resin-sealed lead frame RFP is disposed on the main surface 2-S1 of the lower mold 2 as shown in FIG. 14, the gap between the main surface 1-S1 of the upper mold 1 and the main surface 2-S1 of the lower mold 2 is widened.

Since dry air whose flow rate is small is supplied to the cover housing 14 through the pipe unit 19-1, the dry air flowing through the space 17 suppresses the rise in the temperature of the sensor 15.

The first end 12-L of the unloader 12 is coupled to a driving mechanism for driving the composite unit LCU as will be explained later by reference to FIG. 17. By this driving mechanism, the composite unit LCU is moved in a direction (←forward) described by "forward" in FIG. 14, and is inserted between the upper mold 1 and the lower mold 2 that are kept opened. That is, the composite unit LCU is inserted so that the rear surfaces 14-S2, 13-S2 and 12-S2 face the main surface 1-S1, and the main surfaces 14-S1, 13-S1, and 12-S1 face the main surface 2-S1. The advance of the composite unit LCU is carried out by moving the side face 14-F, the side face 13-F and the second end 12-F from the first ends 1-L and 2-L of the upper mold 1 and the lower mold 2 toward the second ends 1-F and 2-F. In this case, the composite unit LCU is moved so as to come in no contact with the upper mold 1 and the lower mold 2 and so that the parting face 1-P of the upper mold 1 and the parting face 2-P of the lower mold 2 become parallel with the main surface 12-S1 of the unloader 12.

FIG. 15 shows a state in which the composite unit LCU has advanced to reach a predetermined position. Here, the predetermined position is a position where each of the frame chuck parts PCT formed on the unloader 12 have arrived above the corresponding opening part RCK (FIG. 2C) of the lead frame RFP. Thus, the advance of the composite unit LCU has been completed, and the chucking of the lead frame is started.

Figure 16:
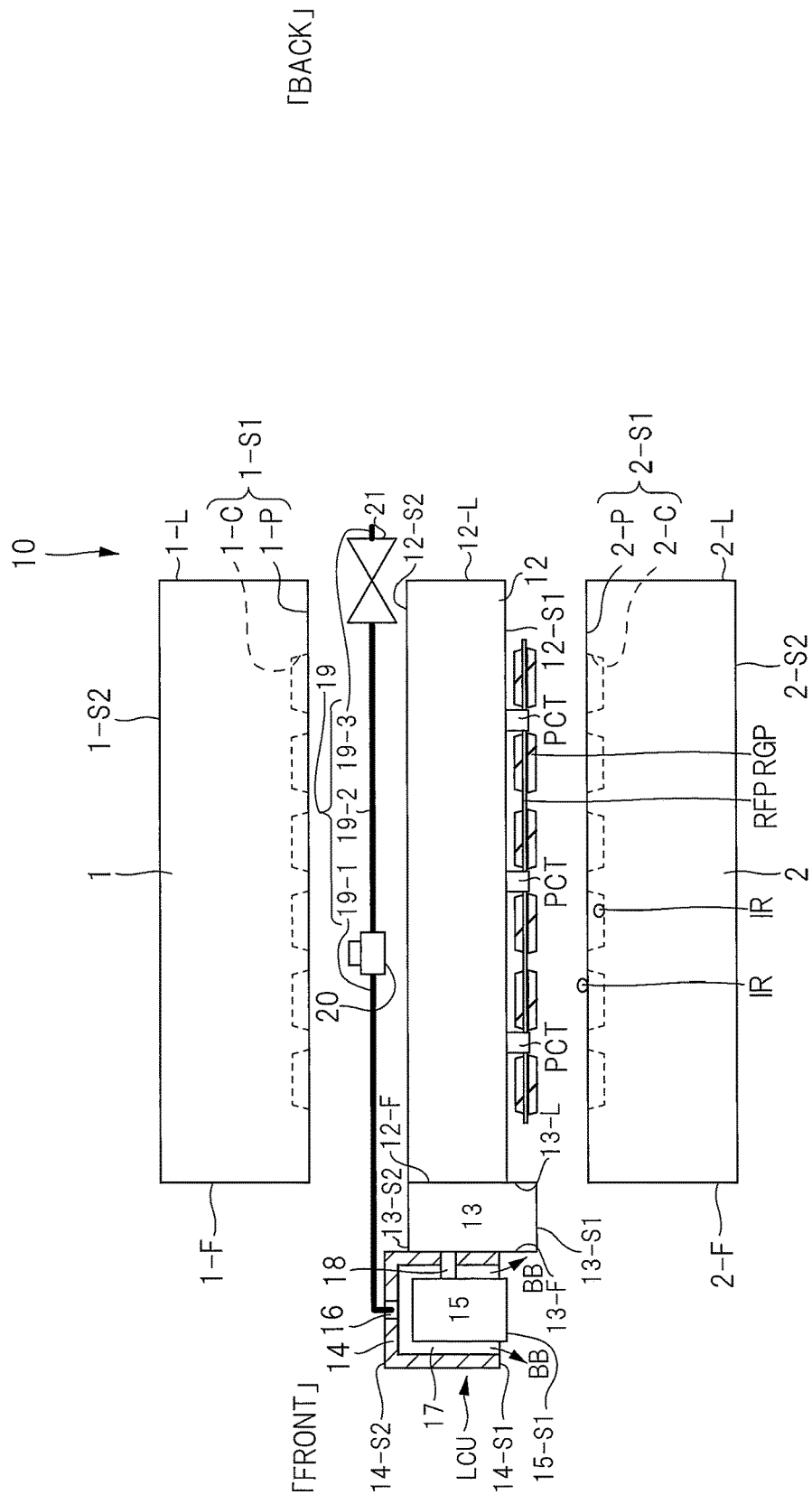
FIG. 16 is a view showing a state of the molding device according to the first embodiment.

In the chucking of the lead frame, a distance between the composite unit LCU and the main surface 2-S1 of the lower mold 2 is made smaller. For example, the composite unit LCU is moved downward by a not-shown driving mechanism. By moving the composite unit LCU downward, the frame chuck part PCT is inserted into the opening part PCK of the lead frame RFP, and the lead frame RFP is fixed onto the unloader 12. In the state where the lead frame RFP is fixed onto the unloader 12, the composite unit LCU is moved upward. FIG. 16 shows a state in which the lead frame RFP is fixed, and the composite unit LCU being moved upward.

As described above, the lead frame chuck relative to the lead frame RFP whose predetermined parts are resin-sealed is completed. Additionally, also in the lead frame chuck, the discharge of slight wind continues in the opening face 14-S1 of the cover housing 14.

Referring to FIG. 6 again, the explanation will be continuously given. When the lead frame chuck is completed at time t2, the composite unit LCU starts retreating as shown in FIG. 6C. FIG. 17 shows a state in which the composite unit LCU starts retreating.

Figure 17:
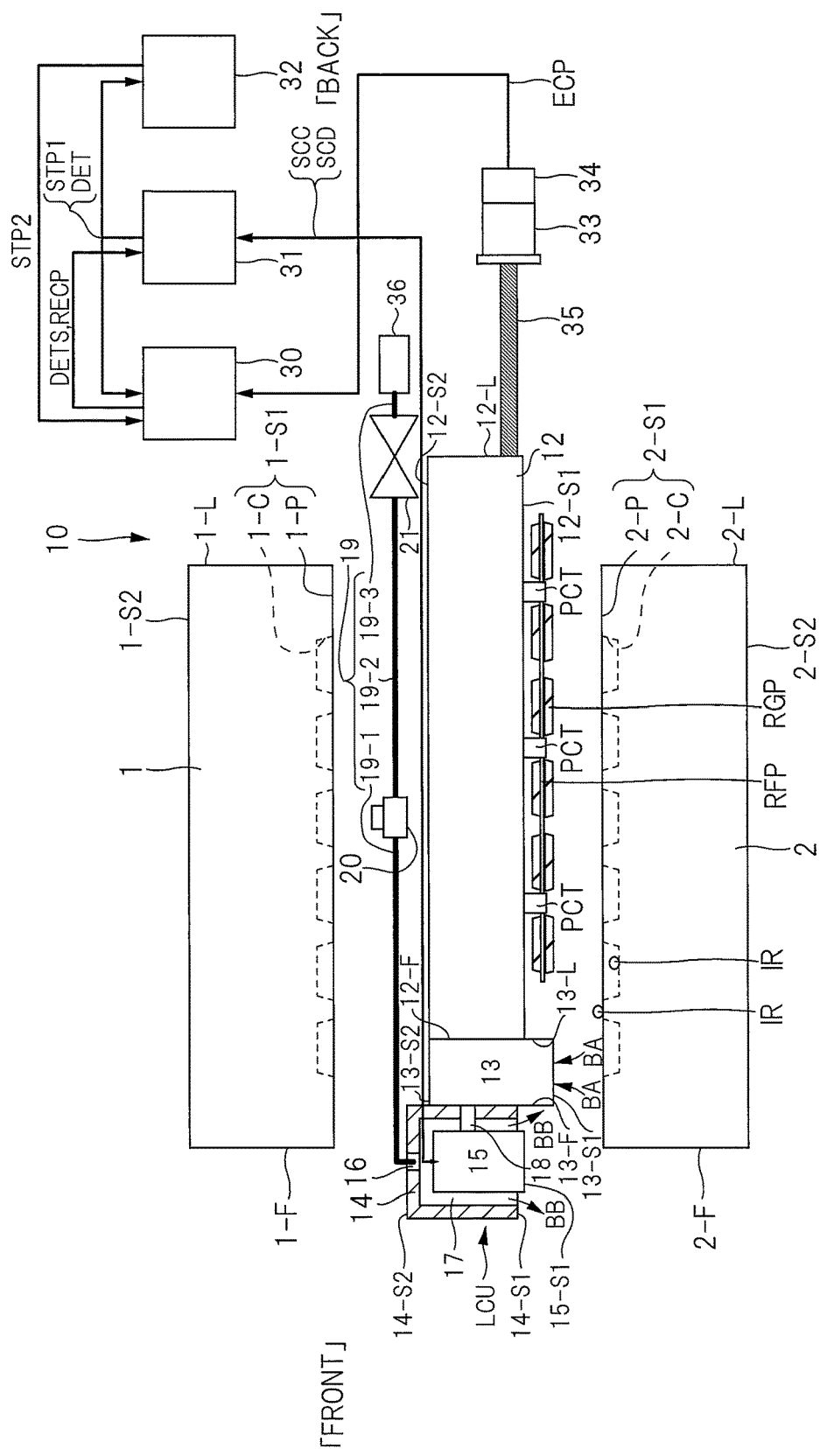
FIG. 17 is a view showing a state of the molding device according to the first embodiment.

In FIG. 17, the reference numeral "33" represents a motor, and "34" represents an encoder that generates an encoder pulse ECP corresponding to the number of rotations of the motor 33. The motor 33 and the first end 12-L of the unloader 12 are coupled to each other by a ball screw 35. Since the motor 33 rotates, the ball screw 35 rotates, and since the ball screw 35 rotates, the unloader 12 advances or retreats. That is, the rotations of the motor 33 cause the composite unit LCU to advance or retreat. Therefore, by the motor 33 and the ball screw 35, a driving mechanism for driving the composite unit LCU is constituted. Moreover, since the encoder pulse ECP outputted from the encoder 14 is generated in response to the number of rotations of the motor 33, it is possible to grasp the position of the composite unit LCU from the encoder pulse ECP irrespective of rotation speed of the motor 33.

The molding device 10 according to the first embodiment has not only the above-mentioned molds (upper mold 1 and lower mold 2), the loader 11, and the composite unit LCU but also the above-mentioned driving mechanism, and further a controller 30 and a recognition unit 31.

The recognition unit 31 is connected to the sensor 15 housed in the cover housing 14 so as to supply a scanning start signal SCC to the sensor 15. The sensor 15 photographs in response to the scanning start signal SCC and supplies, as scan image data SCD, data of a photographed image(s) to the recognition unit 31. The recognition unit 31 determines, from the supplied scan image data SCD, whether or not any foreign matters are present. That is, by the sensor 15 and the recognition unit 31, an inspection as to whether or not the foreign matters are present on the main surface of the lower mold 2 is carried out. If it is determined that the foreign matters are present in the inspection, the recognition unit 31 grasps a size of each of the detected foreign matters and the number of the foreign matters, and further determines whether or not any foreign matters having a size(s) exceeding a predetermined size (threshold value) are present. However, the recognition unit is not particularly limited thereto. When it is determined that foreign matters having the size(s) exceeding the threshold value are present, the recognition unit 31 supplies a stop signal STP1 to the controller 30. The threshold value in this case corresponds to the sizes of the foreign matters causing some problems at the time of the mass-production (for example, about several hundred micrometers).

Moreover, the recognition unit 31 supplies, as recognition results DET, a managing server 32 with presence/absence of the foreign matters, the sizes of the foreign matters, the number of foreign matters, and presence/absence of any foreign matters having a size(s) exceeding the threshold value. The managing server 32 is installed not at the molding device 10 but in a factory, and is a common server for managing a plurality of manufacturing devices (including the molding device 10) installed in the factory. A factory dry air source 36 coupled to the pipe 19-3 is also installed not at the molding device 10 but in the factory in the same manner.

The controller 30 controls the entire molding device 10. For example, the controller 30 receives the encoder pulse ECP from the encoder 34, grasps the position of the composite unit LCU, and controls the number of rotations and a rotation direction of the motor 30 based upon the grasped position so that the composite unit LCU reaches a desired position. Besides these, the controller 30 also controls the loader 11, and the presser, etc. However, in the present specification, explanations are given only to the control relating to the composite unit LCU.

The controller 30 causes the composite unit LCU to advance by the driving mechanism. If it is determined that the composite unit LCU has reached a predetermined position based upon the encoder pulse ECP, the controller 30 controls the driving mechanism so that the lead frame RFP is fixed to composite unit LCU as shown in FIG. 16. Thereafter, the controller 30 causes the composite unit LCU to retreat by the driving mechanism. When the composite unit retreats, the controller 30 operates a not-shown dust collector, also supplies a recognition start trigger DETS to the recognition unit 31, and supplies an encoder pulse RECT synchronizing to the encoder pulse ECP thereto. In the first embodiment, the controller 30 determines the position of the composite unit LCU based upon the encoder pulse ECP, and controls the flow-rate adjusting valve 20 based upon the position. In the first embodiment, the composite unit LCU reaches the predetermined position at time t2 when the retreating is started, and the flow-rate adjusting valve 20 is controlled so that the flow rate of dry air becomes large.

When the above-mentioned recognition start trigger DETS is supplied, the recognition unit 31 forms a scanning start signal SCC and causes the sensor 15 to carry out the photography in synchronization with the encoder pulse RECT. Incidentally, the line sensor forming the sensor 15 photographs a surface (main surface 2-S1) that faces the photographing surface 15-S1.

When the stop signal STP1 is supplied from the recognition unit 31, the controller 30 stops the motor 33 forming the driving mechanism. Moreover, even when a stop signal STP2 is supplied from the managing server 32, the controller 30 stops the motor 33.

For example, when a recognition result(s) DET is not regularly supplied from the recognition unit 31, the managing server 32 generates the stop signal STP2. When the molding device 10 appropriately operates, it regularly becomes the "lead frame taking-out" state. Each time the molding device becomes the "lead frame taking-out" state, scan image data SCD is supplied to the recognition unit 31, and the recognition result DET is supplied to the managing server 32 irrespective of the stop signal STP1. On the other hand, when any abnormality occurs in the molding device 10 and the molding device does not operate appropriately, the molding device falls into a state of generating no "lead frame taking-out" state. In this case, the scan image data SCD is not supplied to the recognition unit 31. As a result, the recognition result DET is no longer supplied to the managing server 32. Therefore, when the recognition result DET is not regularly supplied to the managing server 32, the managing server 32 determines that the molding device 10 is not operated appropriately, and generates the stop signal STP2.

Moreover, even when any abnormality occurs in the sensor 15 or/and the recognition unit 31, the recognition result DET is not regularly supplied to the managing server 32. For this reason, even when the inspection mechanism (sensor 15 and recognition unit 32) is not operated appropriately, the stop signal STP2 is generated. When the stop signal STP2 is generated in this manner, the molding device 10 is stopped. Therefore, it becomes possible to prevent a defective product(s) from being produced when the molding device 10 or the inspection mechanism is not operated appropriately, and to consequently reduce a risk of generating such a defective product(s).

Furthermore, the managing server 32 estimates the state of the molding device 10 based upon the recognition result DET regularly supplied thereto, and generates the stop signal STP2 based upon the estimation. For example, when the number of foreign matters having a size(s) not exceeding the threshold value increases in the recognition result DET continuously supplied thereto, the managing server 32 estimates that maintenance of the molding device 10 should be desirably carried out, and the managing server 32 stops the molding device 10 by generating the stop signal STP2. That is, the managing server 32 grasps tendency of the foreign matters from the number of foreign matters having the size not exceeding the threshold value. If the tendency shows an increase in the number of foreign matters, the managing server estimates the tendency to be a situation for carrying out the maintenance, and stops the molding device 10. From the viewpoint of grasping the tendency of the foreign matters, the managing server 32 may be regarded as executing tendency management of the foreign matters based upon the recognition result regularly supplied thereto. In a case of having been regarded as such, when the number of foreign matters that have the size(s) not exceeding the threshold value exceeds a predetermined value (tendency managing threshold value), the managing server 32 stops the molding device 10.

FIG. 6D shows timing of the dust collector controlled by the controller 30 in the "lead frame taking-out" state. Moreover, FIG. 6E shows a waveform of the aforementioned recognition start trigger signal, and FIG. 6F shows waveforms of the aforementioned encoder pulse signals ECP and RECP. Furthermore, FIG. 6G shows photographing timings of the sensor 15, FIG. 6H shows operations of the recognition unit 31, and FIG. 6I shows the aforementioned stop signal STP1. Incidentally, FIG. 6I shows a waveform when it is determined that any foreign matters are present by a foreign-matter presence/absence determination of the recognition unit 31.

Moreover, FIG. 6J indicates a flow-rate variation of dry air that varies depending on the control of the flow-rate adjusting valve 20 by the controller 30. The flow-rate variation shown in FIG. 6J corresponds to a flow-rate variation of dry air that is discharged from the cover housing 14.

<<<Operations of Retreating>>>

Referring to FIG. 6 and FIG. 17, explanation will be given to operations at the time when the composite unit LCU retreats. When the frame chucking is completed at time t2, the controller 30 rotates the motor 33 in a direction opposite to the "forward" direction. Thus, the ball screw 35 is rotated in the opposite direction so that the composite unit LCU retreats as shown in FIG. 6C.

When the composite unit LCU retreats, the composite unit LCU is moved in a direction described as "back" (←backward) in FIG. 17, and the composite unit LCU with the lead frame RFP fixed thereon is taken out from a space between the upper mold 1 and the lower mold 2 that are kept opened. That is, in a state where the rear surfaces 14-S2, 13-S2 and 12-S2 face the main surface 1-S1 and the main surfaces 14-S1, 13-S1, and 12-S1 face the main surface 2-S1, the composite unit LCU is moved in a retreating direction. When the composite unit LCU retreats, the side face 14-F, the side face 13-F, and the second end 12-F are moved from the second ends 1-F and 2-F sides of the upper mold 1 and the lower mold 2 toward the first ends 1-L and 2-L sides. Also in this case, the composite unit LCU is moved so as to come in no contact with the upper mold 1 and the lower mold 2 and so that the parting face 1-P of the upper mold 1 and the parting face 2-P of the lower mold 2 are parallel with the main surface 12-S1 of the unloader 12.

When the composite unit LCU starts retreating, the controller 30 operates the duct collector, as shown in FIG. 6D. Thus, the suction is started on the opening face 13-L1 of the cleaning mechanism 13 so that the foreign matters IR present on the main surface 2-S1 of the lower mold 2 are dust-collected together with air. As shown in FIG. 6D, during a period in which the composite unit LCU is retreating, an operating state of the dust collector is maintained. Therefore, while the opening surface 13-S1 moves from the second end 2-F side toward the first end 2-L side of the lower mold 2 along with the retreating of the composite unit LCU, the dust-collection is carried out to the foreign matters on a main surface portion of the lower mold 2 that faces the opening face 13-S1. That is, the cleaning is successively carried out from the second end 2-F side toward the first end 2-L side of the lower mold 2.

When the controller 30 grasps from the encoder pulse ECP that the composite unit LCU has started retreating and has reached a predetermined position, it generates a recognition start trigger signal DETS as shown in FIG. 6E, and simultaneously generates an encoder pulse RECT. When the recognition start trigger signal DETS is supplied thereto, the recognition unit 31 generates a scanning start signal SCC, and causes the sensor 15 to start the photography. The sensor 15 is constituted by a line sensor, and the recognition unit 31 causes it to execute the photography by the unit of a predetermined number of pulses of the encoder pulse RECT. The photographing surface 15-S1 of the sensor 15 is moved from the second end 2-F side toward the first end 2-L side of the second mold 2 along with the retreating of the composite unit LCU, and the sensor successively carries out the photography from the second end 2-F side toward the first end 2-L side, so that data of the photographed images is supplied as scan image data SCD to the recognition unit 31.

In the composite unit LCU, the sensor 15 is disposed at a position distant or separate from the cleaning mechanism 13 relative to the first end 12-L as shown in FIG. 17. For this reason, when the composite unit LCU retreats, the sensor 15 photographs the main surface portion that has been cleaned by the cleaning mechanism 13. That is, it photographs the main surface portion (position) that has been cleaned on the main surface 2-S1 of the lower mold 2, and the data of the photographed image is supplied as scan image data SCD to the recognition unit 31.

More specifically, as shown in FIG. 17, in a cross-sectional view, the unloader (arm) 12 includes: a first end 12-L; a second end 12-F opposite to the first end; and a main surface 12-S1 having a chuck part PCT that is disposed between the first end 12-L and the second end 12-F and holds the lead frame RFP. Here, the cleaning mechanism 13 is disposed on the second end 12-F side of the arm 12, and the sensor 15 is disposed on the second end 12-F side of the arm 12 across (via) the cleaning mechanism 13 in a cross-sectional view. Moreover, the lower mold 2 (or the upper mold 1) includes: a first end 2-F (or first end 1-F); a second end 2-L (or second end 1-L) opposite to the first end 2-F (or first end 1-F); and a main surface 2-S1 (or main surface 1-S1) on which a plurality of cavity parts 2-C (or cavity parts 1-C) present between the first end 2-F (or first end 1-F) and the second end 2-L (or second end 1-L) are formed. In this case, a step of taking out the lead frame RFP from the lower mold 2 (or upper mold 1) that has been heated has the following steps.

First, the second end 12-F of the arm 12 is moved from the second end 2-L side toward the first end 2-F side of the lower mold so that the main surface 12-S1 of the arm 12 and the main surface 2-S1 of the lower mold 2 become parallel with each other. Thereafter, the lead frame RFP is held by the chuck part PCT of the arm 12. Moreover, the second end 12-F of the arm 12 is moved from the first end 2-F side toward the second end 2-L side of the lower mold 2 so that the main surface 12-S1 of the arm 12 and the main surface 2-S1 of the lower mold 2 become parallel with each other.

Here, when the second end 12-F of the arm 12 is moved from the first end 2-F side toward the second end 2-L side of the lower mold 2, the cleaning by the cleaning mechanism 13 and the photography by the sensor 15 are carried out.

That is, in a cross-sectional view, since the cleaning mechanism 13 is arrange so as to be sandwiched by the arm 12 and the sensor 15 and the second end 12-F of the arm 12 is moved from the first end 2-F side to the second end 2-L side of the lower mold 2, the photography can be carried out by the sensor 15 from one portion of the main surface of the cleaned mold, so that productivity and turnaround time can be improved.

For example, when the sensor 15 is disposed so as to be sandwiched by the arm 12 and the cleaning mechanism 13 and the second end 12-F of the arm 12 is moved from the first end 2-F side toward the second end 2-L side of the lower mold 2, the sensor 15 photographs (inspects) one portion of the main surface of the mold that has passed the sensor 15 and has been cleaned by the cleaning mechanism 13. It becomes necessary for such an operation that the second end 12-F of the arm 12 is once moved from the first end 2-F side toward the second end 2-L side of the lower mold 2, and the second end 12-F of the arm 12 needs to be again moved from the first end 2-F side to the second end 2-L side of the lower mold 2. As a result, in a state where the cleaning mechanism 13 is disposed so as to be sandwiched by the arm 12 and the sensor 15 and the second end 12-F of the arm 12 is moved from the first end 2-F side to the second end 2-L side of the lower mold 2, those lead to improvement etc. of the productivity.

The scan image data SCD is successively supplied to the recognition unit 31 from the sensor 15 so that a mold surface image(s) of the main surface 2-S1 of the lower mold 2 can be obtained. As shown in FIG. 6H, after obtaining the mold surface image, the recognition unit 31 determines presence/absence of any foreign matters. The determination can be made, as described above, based upon whether to exceed the threshold value. When it is determined that any foreign matters are present, the recognition unit 31 generates the stop signal STP1 as shown in FIG. 6I, and supplies the signal to the controller 30, and also supplies the recognition result DET to the managing server 32. If it is determined that no foreign matter is present, the recognition unit 31 does not generate the stop signal STP1, and supplies the recognition result DET to the managing server 32.

In the present embodiment, as shown in FIG. 6J, when causing the composite unit LCU to retreat, the controller 30 makes the flow rate of dry air greater (strong wind) by the flow-rate adjusting valve 20. Thus, the flow rate of dry air to be supplied to the cover housing 14 through the pipe unit 19-1 is increased, so that the flow rate of dry air to be discharged from a periphery of the sensor 15 is increased, and the capability of cooling the sensor 15 can be enhanced. In order to clean the main surface 2-S1 by the cleaning mechanism 13, even if the distance between the composite unit LCU and the lower mold 2 is made smaller than, for example, that at the time of advancing the composite unit LCU, the cooling capability is made higher than that at the time of the advance and the lead frame chuck, so that it becomes possible to suppress deterioration in of characteristics or/and a decrease in life cycle of the sensor 15. In FIG. 6J, the flow rate becomes larger even in the "material throwing-in" state and the "resin-sealing" state, but the flow rate may be made smaller in these states.

Incidentally, a flow rate (large flow rate: strong wind) of dry air required for cooling the sensor 15 is determined in the following manner: the sealing is carried out by, for example, the molding device 10 a plurality of times; such a flow rate as to make the temperature of the sensor 15 equal to or lower than operable temperature for each time of the sealing is found; and, for example, an average value of the flow rates thus found may be defined as the flow rate of dry air to be required. Here, the operable temperature is set as a temperature capable of suppressing the deterioration in characteristics or/and the decrease in the life cycle of the sensor 15. To give an example, the operable temperature is set to, for example, 50° C. to 60° C.

As shown in FIG. 6I, when the stop signal STP1 is generated, the controller 30 stops the rotation of the motor 33. Thus, the lead frame taking-out by the composite unit LCU is stopped thereafter.

Also with respect to the driving mechanism for driving the loader 11, the controller 30 stops its operation when the stop signal STP1 is generated. Thus, since the sealing by the molding device 10 is stopped, a decrease in yield caused by any foreign matters present on the mold can be reduced. During a period in which the molding device 10 is stopped, the cleaning is carried out to remove the foreign matter(s) specified by, for example, the scan image data SCD, and then the manufacture may be resumed by reactivating the molding device 10.

Even when the stop signal STP2 is generated, of course, the controller 30 stops both of the driving mechanisms. In this case, while the molding device 10 is stopped, the maintenance may be performed.

Moreover, the driving mechanism for driving the composite unit LCU may be compatibly used as a driving mechanism for driving the loader 11. In this case, the controller 30 causes the motor 33 to stop, and thereby can cause the molding device 10 to stop.

Figure 18:
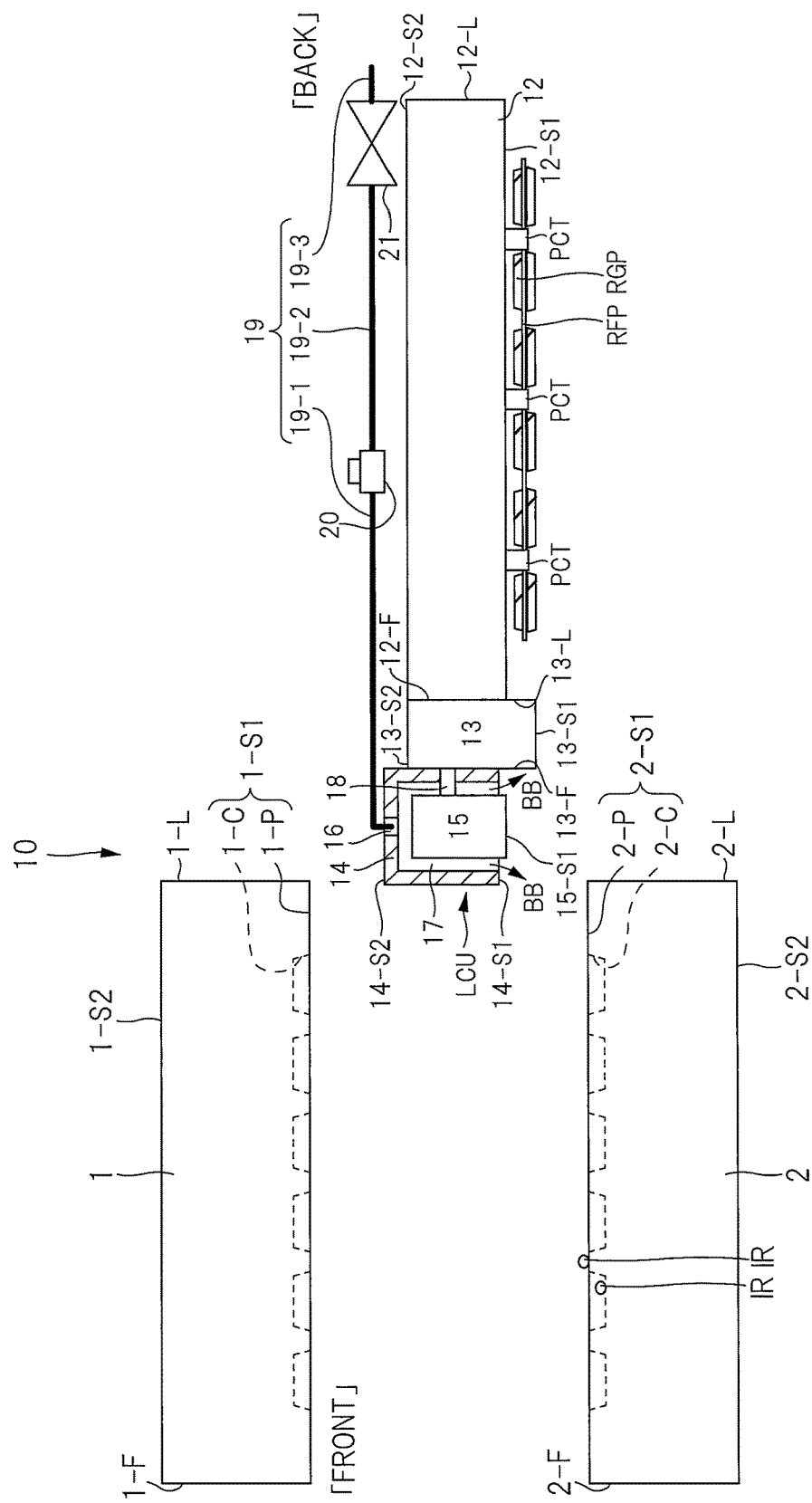
FIG. 18 is a view showing a state of the molding device according to the first embodiment.

FIG. 18 shows a state in which the composite unit LCU is taken out from the gap between the upper mold 1 and the lower mold 2. Also in this state, dry air is supplied from the pipe 19-1 to the cover housing 14, and discharged from the periphery of the sensor 15. At this time, the lead frame RFP, which is partially resin-sealed, is still fixed to the composite unit LCU, but its outer shape becomes a shape as shown in FIG. 3A. Thereafter, by performing step S7 or the like shown in FIG. 1, a plurality of semiconductor devices SHP are obtained from a sheet of partially resin-sealed lead frame RFP.

In the first embodiment, during one cycle, that is, during the "material throwing-in" state, the "resin-sealing" state, and the "lead frame taking-out" state, the upper mold 1 and the lower mold 2 are continuously heated and maintained at, for example, 180° C. During the cycle, the sensor 15 is continuously cooled by air that is discharged in an arrow direction (BB) from the main surface 1-S1 of the upper mold 1 toward the main surface 2-S1 of the lower mold 2. Thus, the main surface 2-S1 of the lower mold 2 can be inspected while suppressing the deterioration in the characteristics or/and the decrease in the life cycle of the sensor 15

The sensor 15 can also be cooled by air that is sucked in a direction from the lower mold 2 toward the upper mold 1. However, there becomes a strong possible that such suction will collect dusts or the like from the lower mold 2 into the cover housing 14, and there is a possible that dusts or the like will adhere to the sensor 15. In contrast, if air is discharged as shown in the first embodiment, the inside of the cover housing 14 becomes a positive pressure relative to the outside, so that dusts or the like are prevented from entering the inside of the cover housing 14, and the discharged air conversely functions to blow dusts or the like from the sensor 15. Therefore, air (dry air) is desirably discharged as explained in the first embodiment.

The cooling mechanism for cooling the sensor has been shown as an example of utilizing dry air, but is not limited to this. For example, a cooling device such as a Peltier element may be used as the cooling mechanism.

Moreover, in the first embodiment, a line sensor is used as the sensor 15. A sensor having a wide angle capable of photographing a wider range at one time can be used as the sensor. However, when the sensor having a wide angle is used, it is considered that the main surface portion which has not been cleaned by the cleaning mechanism 13 may be photographed. For example, when the entire region of the main surface 2-S1 of the lower mold 2 is photographed from the vicinity of a center of the lower mold 2 by the sensor with a wide angle, the first end 2-L side of the lower mold 2 has not yet been cleaned, so that scan image data SCD including the main surface portion before the cleaning is obtained. Even when the recognition unit 31 determines based upon the obtained scan image data SCD that any foreign matters are present, there is a possibility that the foreign matters will be removed by the cleaning in order that the data includes the state before the cleaning, so that the molding device 10 may be caused to unnecessarily stop. For this reason, the line sensor is desirably used as the sensor 15.

Second Embodiment

Figure 19:
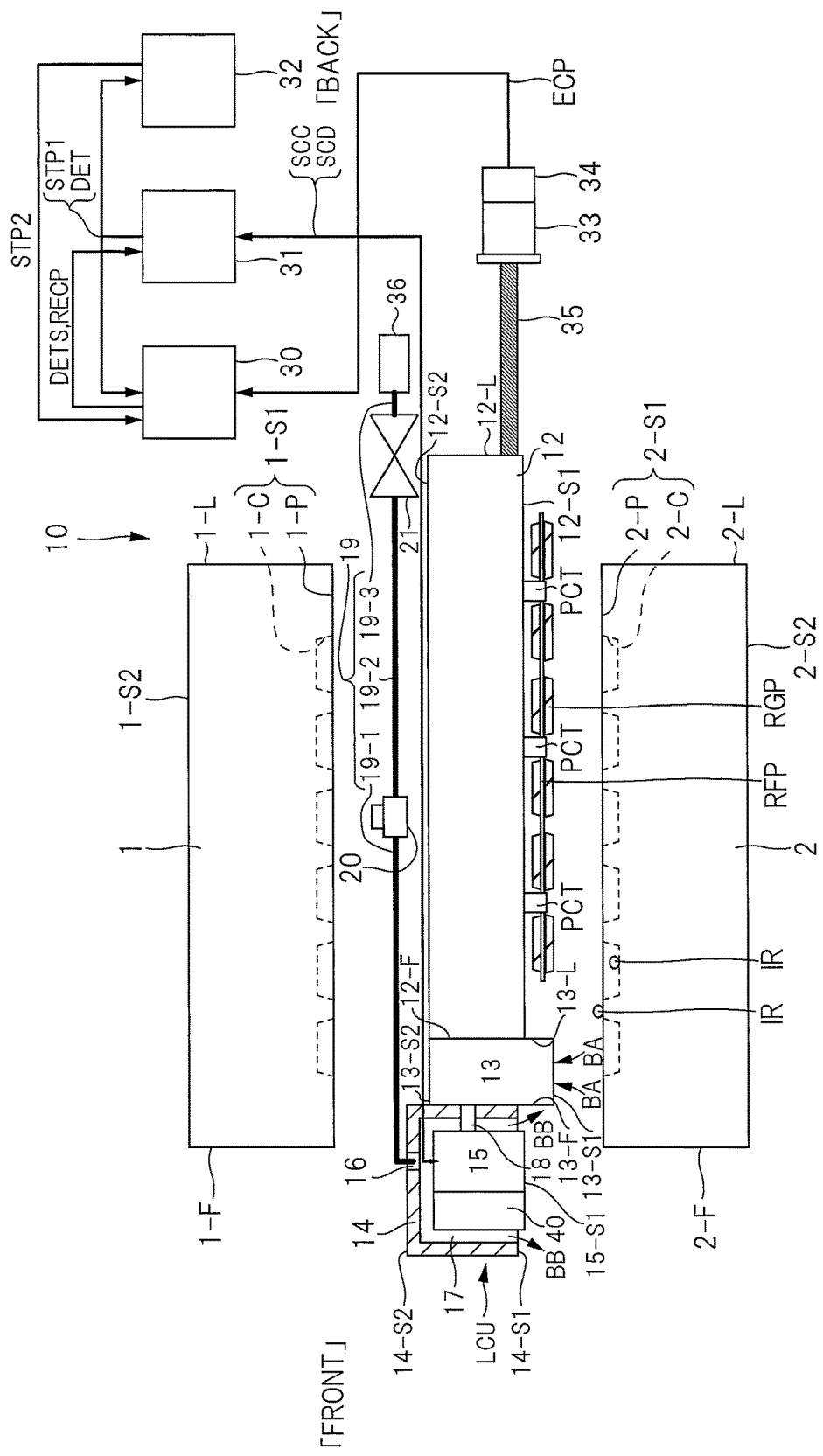
FIG. 19 is a view showing a state of a molding device according to a second embodiment.

FIG. 19 is a view showing a state of a molding device 10 according to a second embodiment. Since FIG. 19 is similar to FIG. 17, differences therebetween will be mainly explained. In the second embodiment, a cooling device 40 is added inside the cover housing 14. The cooling device 40 is constituted by, for example, a Peltier element(s). Although not particularly limited, the cooling device 40 is coupled to the sensor 15. Thus, the sensor 15 is cooled by dry air flowing through the periphery thereof, and is also cooled by the cooling device 40. In the first embodiment, the sensor 15 is cooled so as to be equal to or lower than the operable temperature by the dry air flowing through the periphery thereof. However, in accordance with the second embodiment, the sensor 15 can be maintained at a lower temperature. Thus, it becomes possible to further reduce the deterioration in the characteristics due to the temperature, and consequently to use the sensor 15 for a longer period of time. Moreover, in the same manner as in the first embodiment, it is also possible to reduce dusts adhering to the photographing surface 15-S1 of the sensor 15.

The cooling device 40 may be designed to always cool the sensor 15. However, for example, only when the composite unit LCU is caused to retreat by the controller 30, the cooling device 40 may be controlled to cool the sensor 15.

Moreover, while the sensor 15 is always cooled by the cooling device 40, dry air may flow in the periphery of the sensor 15 only when the composite unit LCU retreats.

Third Embodiment

Figure 20:
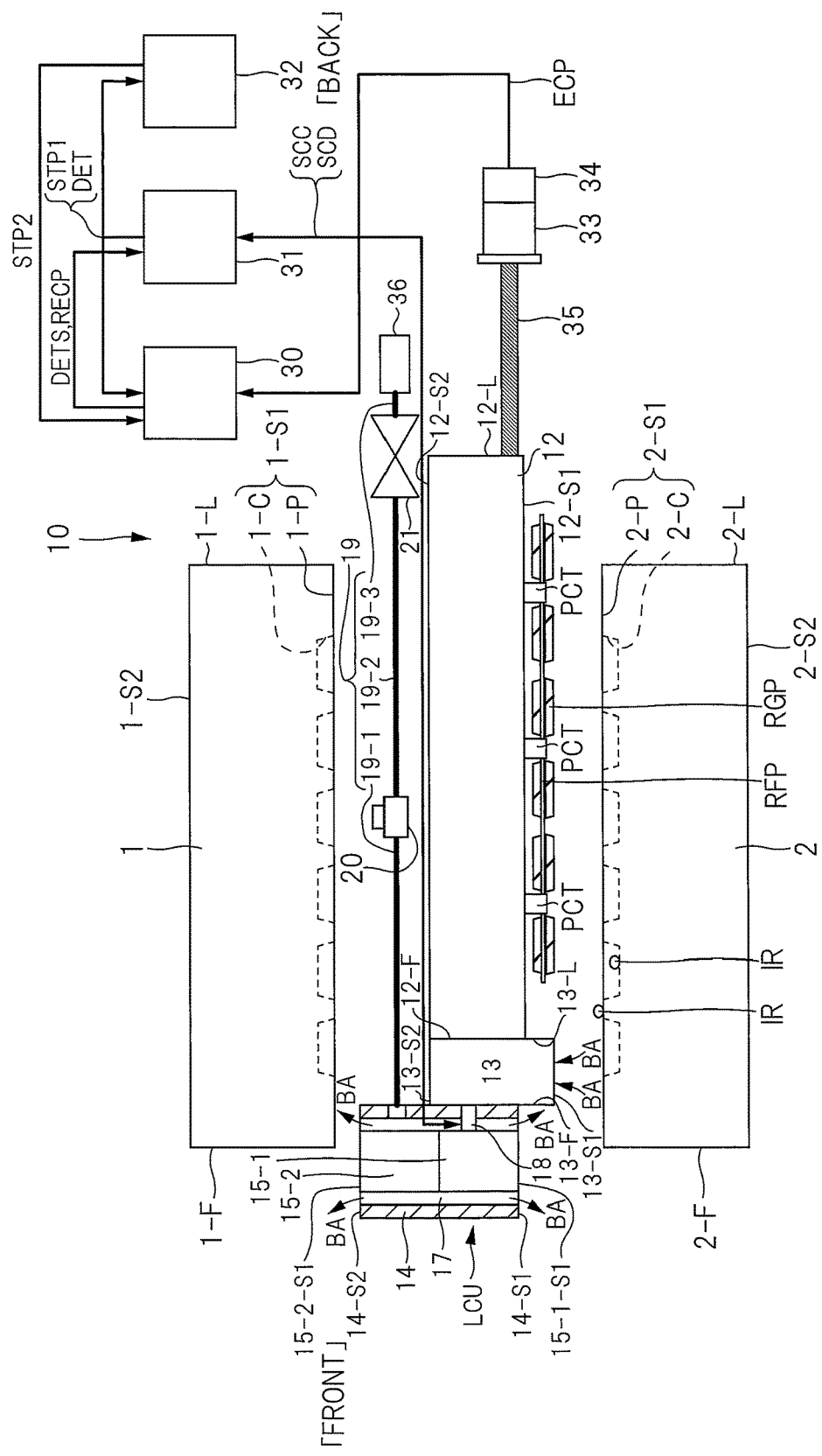
FIG. 20 is a view showing a state of a molding device according to a third embodiment.

FIG. 20 is a block diagram showing a configuration of a molding device 10 according to a third embodiment. Since FIG. 20 is also similar to FIG. 17, only differences therebetween will be mainly explained here.

In the present third embodiment, the rear surface 14-S2 of the cover housing 14 also has an opening face, and two sensors 15-1 and 15-2 are disposed inside the cover housing. Here, a photographing surface 15-1-S1 of the sensor 15-1 faces the main surface 2-S1 of the lower mold 2 in the same manner as those in the first and second embodiments, and is designed to photograph the main surface 2-S1. On the other hand, the sensor 15-2 has its photographing surface 15-2-S1 facing the main surface 1-S1 of the upper mold 1, and photographs the main surface 1-S1 of the mold 1 when the composite unit LCU retreats.

Since the rear surface 14-S2 of the cover housing 14 also has an opening face, dry air is discharged from the respective opening faces of the cover housing 14 toward the upper mold and the lower mold. Thus, dry air flows in the respective peripheries of the sensor 15-1 and the sensor 15-2, which suppresses rises in the temperatures of the sensor 15-1 and the sensor 15-2 and makes it possible to present dusts or the like from adhering to the respective photographing surfaces.

In the present third embodiment, scan image data relating to the upper mold 1 and scan image data relating to the lower mold 2 are supplied to the recognition unit 31. When determining that any foreign matters are present on any of the upper mold 1 and the lower mold 2 by those scan data, the recognition unit 31 generates a stop signal STP1. Moreover, recognition results DET of the respective scan image data are supplied to the managing server 32.

The third embodiment can detect not only the foreign matters on the main surface of the lower mold 2 but also the foreign matters on the main surface of the upper mold 1. As a result, it becomes possible to further reduce a risk of generating a defective semiconductor product(s) due to the foreign matters.

Of course, also in the present third embodiment, the cooling device 40 as explained in the second embodiment may be coupled to each of the sensors 15-1 and 15-2.

In the first to third embodiments, based upon not visual inspection, but data of an image(s) (scan image data CSD) photographed by the sensor 15, the recognition unit 31 determines presence/absence of the foreign matter(s). That is, since the determination of the presence/absence of the foreign matters is made by an image processing in the recognition unit 31, the foreign matter(s) can be detected at high speed. In the mass production of the semiconductor device SHP, the moving speed of the composite unit LCU becomes, for example, about 400 mm/sec in maximum. However, even when the composite unit LCU is moved (retreated) at this moving speed, the foreign matters that are present on the main surface of the mold can be detected. Moreover, resolution of the sensor 15 is higher than that of the visual inspection, and is capable of discriminating resin waste of, for example, several micrometers. Therefore, the presence of resin waste having a size(s) likely to cause a problem(s) at the time of the mass-production can be also detected.

Moreover, since the photographing is carried out in synchronization with the pulse RECP synchronizing with the encoder pulse ECP, a predetermined position can be photographed even when retreating speed of the composite unit LCU varies. Therefore, it is possible to obtain an image(s) of the main surface of the mold with stable quality. Since any foreign matters are detected by the image processing in the recognition unit 31, it is possible to suppress deviations in size among the foreign matters that can be detected in comparison with the visual inspection. In the case of the image processing, the deviations in size among the foreign matters that can be detected are within a range of, for example, several tens of micrometers. Thus, it is possible to carry out stable detection at the time of the mass-production.

Moreover, since the visual detection is not carried out, it is possible to avoid enormous labor costs from being continuously caused.

In the molding device 10, the molds 1 and 2 are always in a heated state, and the molds are placed in a dusty environment in which dusts or the like are accumulated. Even under this environment, the sensor 15 is housed in the cover housing 14, and dry air is discharged, so that the inspection can be carried out at high speed while the deterioration in the characteristics or/and the decrease in the life cycle of the sensor 15 are suppressed. That is, any foreign matters on the molds can be inspected at the time of mass-producing the semiconductor device SHP.

Moreover, the managing server 32 estimates the state of the molding device 10 based upon recognition results DET that are regularly supplied thereto. Thus, maintenance of the molding device 10 can be carried out so as to prevent a defective product from being generated. Furthermore, since the managing server 32 monitors whether or not the recognition results DET are regularly supplied, it becomes possible to grasp whether or not the molding device 10 or/and the inspection mechanism (sensor 15, recognition unit 31) operates in an appropriate state. Thus, by ensuring that the molding device 10 operates in the appropriate state, it becomes possible to reduce the risk of generating a defective product(s).

In the first to third embodiments, explanation has been given by exemplifying the composite unit LCU in which the sensor 15 to be cooled by the cooling mechanism, the cleaning mechanism 13, and the unloader 12 are integrally formed. However, by using, for example, a composite unit in which the sensor 15 and the loader 11 are integrally formed, the main surface of the mold may be photographed. A composite unit in which the sensor 15 and the unloader 12 are integrally formed may be used, or a composite unit in which the sensor 15 and the cleaning mechanism 13 are integrally formed may be used. In any of the cases, since the sensor 15 is made close to the mold heated at the time of photographing the main surface of the mold, the cooling is carried out as explained in the first to third embodiments. In this manner, the sensor 15 and the cooling mechanism can be integrally formed with other component(s) that constitute the composite unit. However, as explained in the first to third embodiments, when the composite unit in which the sensor, the cleaning mechanism, and the unloader are integrally formed is used, the taking-out of the lead frame, the cleaning of the mold and the photographing of the molds can be carried out concurrently. Thus, it desirably becomes possible to suppress an extension of time required for the resin-sealing at the time of the mass-production.

Moreover, in the first to third embodiments, explanation has been given by exemplifying the QFP. However, the package is not limited to this, and the package may be BGA, SOB or OFM.

Furthermore, in FIG. 17 or the like, an example in which the scan image data SCD is supplied only to the recognition unit 31 is shown, but the scan image data SCD may be supplied also to the controller 30. In the same manner, the encoder pulse ECP may be supplied not only to the controller 30, but also to the recognition unit 31. Moreover, the determination about the presence/absence of any foreign matters based upon the scan image data SCD may be carried out not by the recognition unit 31 but by the controller 30. Further, the first to third embodiments supply the recognition results DET to the managing server 32, but are not limited to this. For example, a storage device may be provided in the molding device 10, and the recognition results DET from the recognition unit 31 may be regularly supplied to the managing server 32 or/and the storage device inside the molding device 10. In this case, the storage device inside the molding device 10 successively stores the recognition results DET regularly supplied thereto.

Moreover, an example in which resin waste is collected is shown as the cleaning mechanism 13, but the present invention is not limited to this. For example, resin waste adhering to the main surfaces 1-S1 and 2-S1 may be scraped off by a brush or the like and collected. Furthermore, the present invention can be applied not only to the case of the mass-production of the semiconductor device SHP but also to a case of regular cleaning work as described in Patent Document 1.

<Additional Note>

In the present specification, a plurality of inventions have been described, and some of them are described in a scope of patent claims. However, inventions other than those are also described, and typical inventions thereof will be enumerated as follows.

(A) A semiconductor manufacturing device includes a lower mold and an upper mold, the lower mold having a main surface on which a plurality of cavity parts are formed, the upper mold having a main surface that opposes the main surface of the lower mold and on which a plurality of cavity parts are formed, a lead frame mounting a semiconductor chip being sandwiched between the main surface of the heated upper mold and the main surface of the heated lower mold to form the partially resin-sealed lead frame, and the semiconductor manufacturing device further includes:

an arm having a first end, a second end, and a chuck part in order to unload the partially resin-sealed lead frame, the second end opposing the first end, the chuck part being disposed between the first and second ends and holding the lead frame, the arm retreating from a side of the first end when the partially resin-sealed lead frame is taken out from between the main surfaces of the upper and lower molds:

a cleaning mechanism disposed on a side of the second end of the arm;

a sensor disposed on the second end side of the arm across the cleaning mechanism; and a cooling mechanism cooling the sensor, wherein the sensor is cooled by the cooling mechanism when the arm retreats, and photographs the main surface of the lower mold in a cooled state.

(B) The semiconductor manufacturing device according to (A) further includes:

a recognition unit detecting foreign matters based upon image data photographed by the sensor;

a motor driving the arm;

an encoder outputting an encoder pulse indicating a position of the arm; and a controller controlling the motor based upon the encoder pulse from the encoder and a result from the recognition unit, wherein the controller stops the motor when the foreign matters is detected by the recognition unit.

(C) In the semiconductor manufacturing device according to (B), a recognition result from the recognition unit is supplied to a managing server and the controller stops the motor based upon an instruction from the managing server.

(D) In the semiconductor manufacturing device according to (C), the sensor includes a line sensor housed in a cover housing, the cover housing provided on the second end side of the arm across the cleaning mechanism and having an opening face opposing the main surface of the lower mold, and air is supplied to the cover housing through a pipe, and the cover housing discharges the air from the opening face toward the main surface of the lower mold.

(E) In the semiconductor manufacturing device according to (D), the air to be discharged from the opening face of the cover housing has a flow rate that is made larger when the arm retreats than that when the arm advances between the main surface of the upper mold and the main surface of the lower mold.

(F) In the semiconductor manufacturing device according to (C), the managing server carries out trend management of the foreign matters.

(G) In the semiconductor manufacturing device according to (F), the managing server causes the controller to stop the motor when the number of foreign matters exceeds a threshold value.

(H) In the semiconductor manufacturing device according to (C), when the recognition result is not regularly supplied, the managing server causes the controller to stop the motor.

(I) The semiconductor manufacturing device according to (B) further includes a storage device storing the recognition result from the recognition unit.

(J) In the semiconductor manufacturing device according to (B), the controller supplies a recognition start trigger signal that causes the recognition unit to start photographing.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A manufacturing method of a semiconductor device comprising:

(a) preparing a lead frame having a plurality of device formation regions;

(b) after the (a), mounting a plurality of semiconductor chips on the plural device formation regions of the lead frame; and (c) after the (b), sealing the plural semiconductor chips and one portion of the lead frame with a sealing resin, wherein the (c) further comprises:

(c1) disposing the lead frame, a mold having a main surface on which a plurality of cavity parts to be respectively arranged in the plural device formation regions are formed, the lead frame being disposed on the main surface of the heated mold;

(c2) after the (c1), injecting a resin onto the main surface of the heated mold so as to seal the plural semiconductor chips and the one portion of the lead frame with the sealing resin; and (c3) after the (c2), taking out the lead frame from the heated mold, wherein in the (c3), the main surface of the mold is inspected by using a sensor while the lead frame is taken out, and the sensor is cooled and formed integrally with an arm that takes out the lead frame.

2. The manufacturing method of a semiconductor device according to claim 1, wherein the (c3) further comprises cleaning the main surface of the mold, and a cleaning mechanism for cleaning the main surface is formed integrally with the arm.

3. The manufacturing method of a semiconductor device according to claim 2,
wherein the sensor includes a line sensor, and
the line sensor photographs the main surface of the mold cleaned by the cleaning mechanism.

4. The manufacturing method of a semiconductor device according to claim 3,
wherein in the (c3), the line sensor is cooled by air discharged toward the main surface of the mold.

5. The manufacturing method of a semiconductor device according to claim 4,
wherein the cleaning is carried out by suction from the main surface of the mold.

6. The manufacturing method of a semiconductor device according to claim 2,
wherein in a cross-sectional view, the arm includes a first end, and a second end, and a first main surface, the second end being opposite to the first end, the first main surface being disposed between the first and second ends and having a chuck part that holds the lead frame,
the cleaning mechanism is disposed on a side of the second end of the arm in a cross-sectional view,
the sensor is disposed on the second end side of the arm across the cleaning mechanism in a cross-sectional view,
the mold includes, in a cross-sectional view, a third end, a fourth end, and a second main surface, the fourth end being opposite to the third end, a plurality of cavity parts present between the third and fourth ends being formed on the second main surface, and
the (c3) comprises:
  (c3-1) moving the second end of the arm from a side of the fourth end of the mold toward a side of the third end so as to make the first and second main surfaces parallel with each other;
  (c3-2) after the (c3-1), holding the lead frame by the chuck part of the arm; and
  (c3-3) after the (c3-2), moving the second end of the arm from the third end side of the mold toward the fourth end side so as to make the first and second main surfaces parallel with each other,
  wherein in the (c3-3), the cleaning by the cleaning mechanism and the photography by the sensor are carried out.

7. The manufacturing method of a semiconductor device according to claim 6,
wherein the sensor is housed in a cover housing, the case housing being disposed on the second end side of the arm across the cleaning mechanism and having an opening face that opposes the main surface of the mold, and
air is supplied to the cover housing through a pipe, and the cover housing discharges the air from the opening face toward the main surface of the mold.

8. The manufacturing method of a semiconductor device according to claim 7,
wherein the cleaning mechanism carries out suction from the main surface of the mold when the arm retreats.

9. The manufacturing method of a semiconductor device according to claim 8,
wherein a flow rate of air discharged from the opening face of the cover housing is smaller when the arm advances on the main surface of the mold than when the arm retreats.

10. The manufacturing method of a semiconductor device according to claim 9,
wherein a cooling mechanism is provided in the cover housing, and the sensor is cooled by the discharge of the air and the cooling by the cooling mechanism.

11. The manufacturing method of a semiconductor device according to claim 10,
wherein the cooling mechanism cools the sensor when the arm advances and retreats, and
when the arm advances, the discharge of the air is stopped and when the arm retreats, the air is discharged.

12. The manufacturing method of a semiconductor device according to claim 6,
wherein the sensor starts photographing when reaching a predetermined position on the main surface of the mold based upon an encoder pulse indicating a position of the arm, and
in the (c3), a recognition unit recognizes a foreign matter based upon data of an image photographed by the sensor and supplies a recognition result to a managing server, and the managing server controls the (c) based upon the recognition result.

13. The manufacturing method of a semiconductor device according to claim 1,
wherein the mold includes, in the (c), an upper mold and a lower mold that sandwich the lead frame, and
in the (c3), the sensor photographs main surfaces of the upper and lower molds, and an inspection for a foreign matter on the main surfaces of the upper mold and the lower mold is carried out based upon the photographed image.

* * * * *